(12) United States Patent
Katsuyama et al.

(10) Patent No.: US 7,379,485 B2
(45) Date of Patent: May 27, 2008

(54) SEMICONDUCTOR OPTICAL DEVICE

(75) Inventors: Tsukuru Katsuyama, Yokohama (JP); Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 304 days.

(21) Appl. No.: 11/230,926

(22) Filed: Sep. 21, 2005

(65) Prior Publication Data

US 2006/0060875 A1    Mar. 23, 2006

(30) Foreign Application Priority Data

Sep. 22, 2004    (JP)    ............................ P2004-276013

(51) Int. Cl.
*H01S 5/00*    (2006.01)
*H01L 29/22*    (2006.01)

(52) U.S. Cl. .............................. 372/46.01; 372/45.01; 257/98

(58) Field of Classification Search ............. 372/46.01, 372/45.01; 257/98
See application file for complete search history.

(56) References Cited

U.S. PATENT DOCUMENTS

| | | | |
|---|---|---|---|
| 5,212,701 A * | 5/1993 | Choquette et al. ........ | 372/45.01 |
| 6,222,871 B1 * | 4/2001 | Chang-Hasnain et al. .... | 372/96 |
| 2006/0120421 A1 * | 6/2006 | Matsuda et al. ......... | 372/43.01 |

FOREIGN PATENT DOCUMENTS

JP    03-020724    1/1991

OTHER PUBLICATIONS

U.S. Appl. No. 11/232,242, filed Sep. 22, 2005, entitled Semiconductor Optical Device.

Nelson, et, "CW Electrooptical Properties of . . . ", IEEE Journal of Quantum Electronics, vol. QE-17, No. 2, Feb. 1981, pp. 202-207.
Osinski, et al, "Treshold Current Analysis of . . . ", IEEE Journal of Quantum Electronics, vol. 29, No. 6, Jun. 1993, pp. 1576-1585.

* cited by examiner

*Primary Examiner*—Minsun Harvey
*Assistant Examiner*—Marcia A. Golub
(74) *Attorney, Agent, or Firm*—Smith, Gambrell & Russell, LLP

(57) ABSTRACT

In a semiconductor optical device, the first conductive type semiconductor region includes a first semiconductor portion and a second semiconductor portion. The first and second regions of the first semiconductor portion are arranged along a predetermined plane. The second semiconductor portion is provided on the first region of the first semiconductor portion. The active layer is provided on the second semiconductor portion of the first conductive type semiconductor region. The second conductive type semiconductor region is provided on the second region of the first semiconductor portion of the first conductive type semiconductor region. The side of the second semiconductor portion of the first conductive type semiconductor region, the top and side of the active layer, the second region of the first conductive type semiconductor region and the second conductive type semiconductor region constitute a pn junction. The first distributed Bragg reflector portion includes first distributed Bragg reflector layers and second distributed Bragg reflector layers which are arranged alternately. The second distributed Bragg reflector portion includes third distributed Bragg reflector layers and fourth distributed Bragg reflector layers which are arranged alternately. The first conductive type semiconductor region, the active layer and the second conductive type semiconductor region are provided between the first distributed Bragg reflector portion and the second distributed Bragg reflector layers.

8 Claims, 19 Drawing Sheets

Fig.1
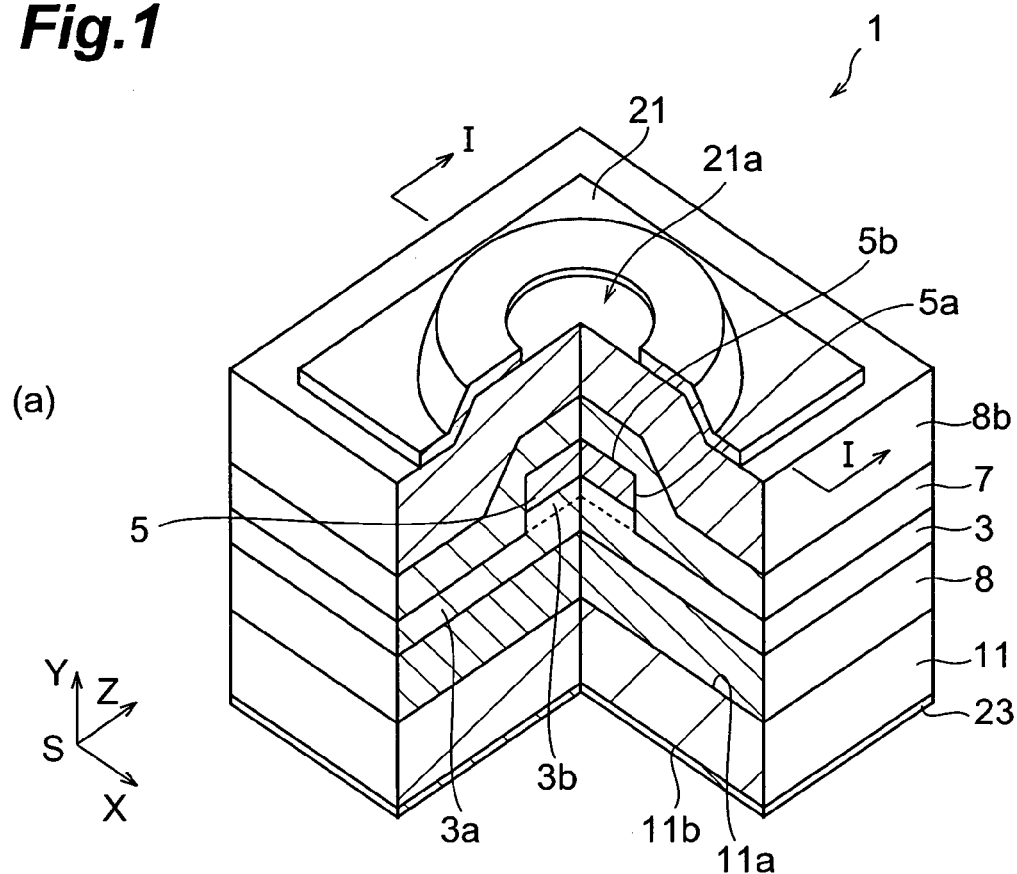
(a)
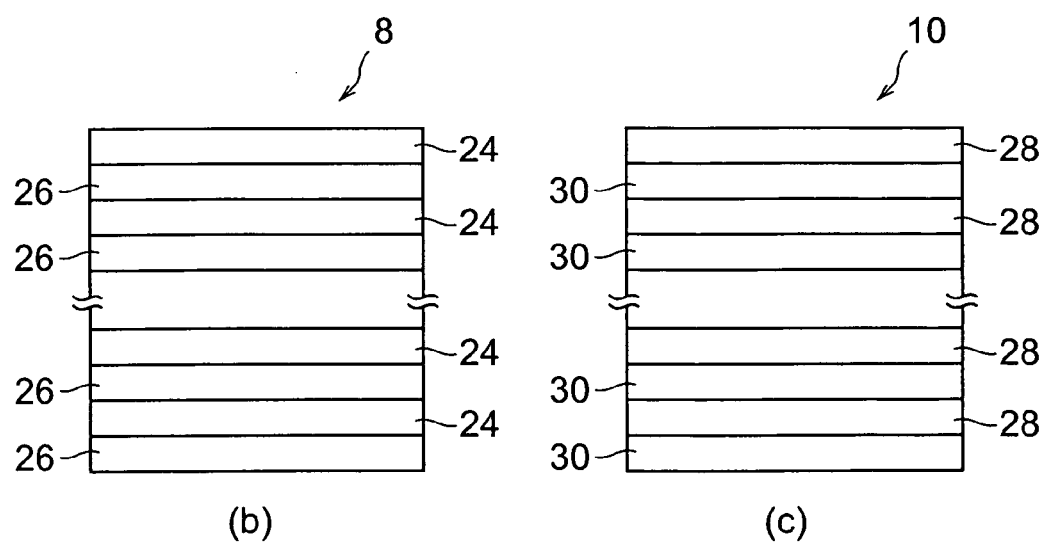
(b)　　　　　　　　　(c)

Fig.2
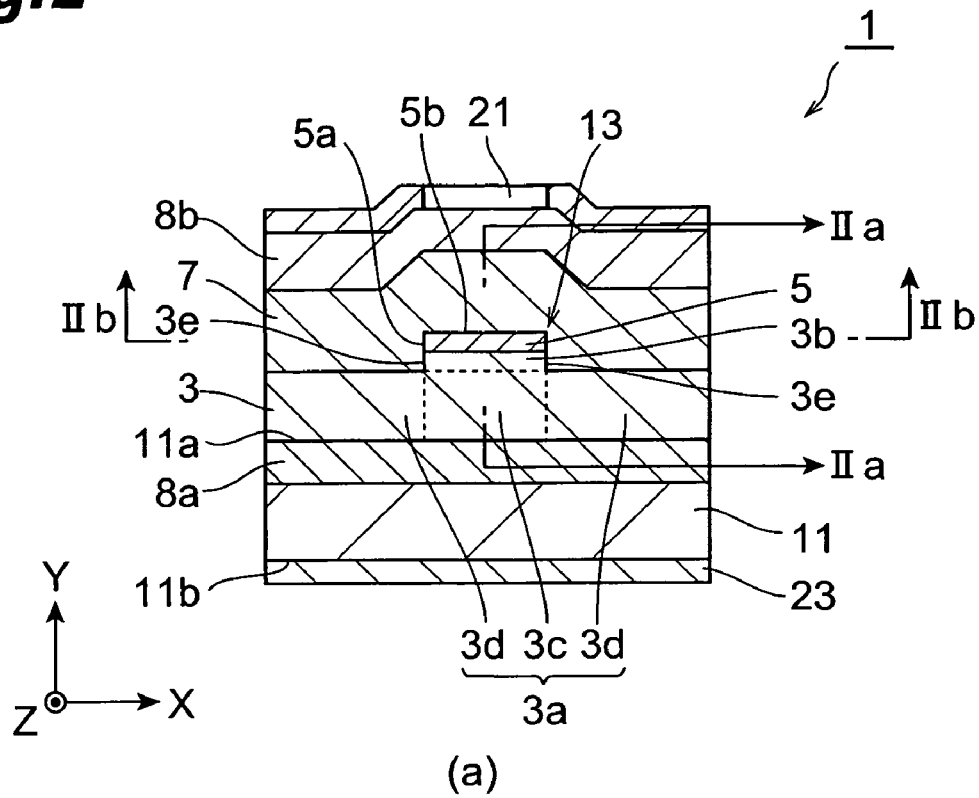
(a)
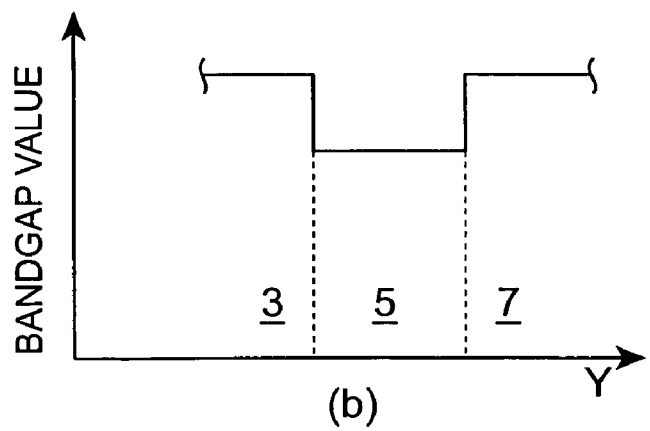
(b)
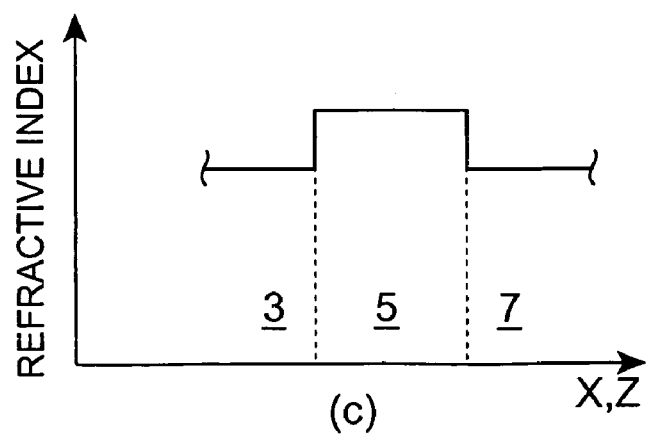
(c)

Fig.4
(a)
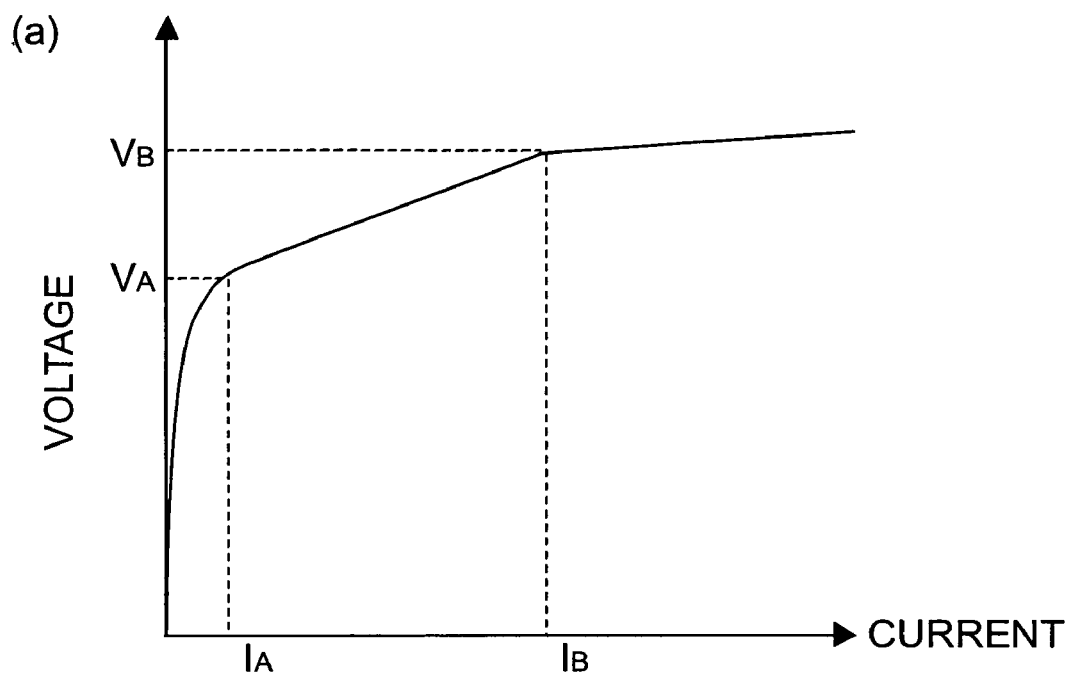
(b)
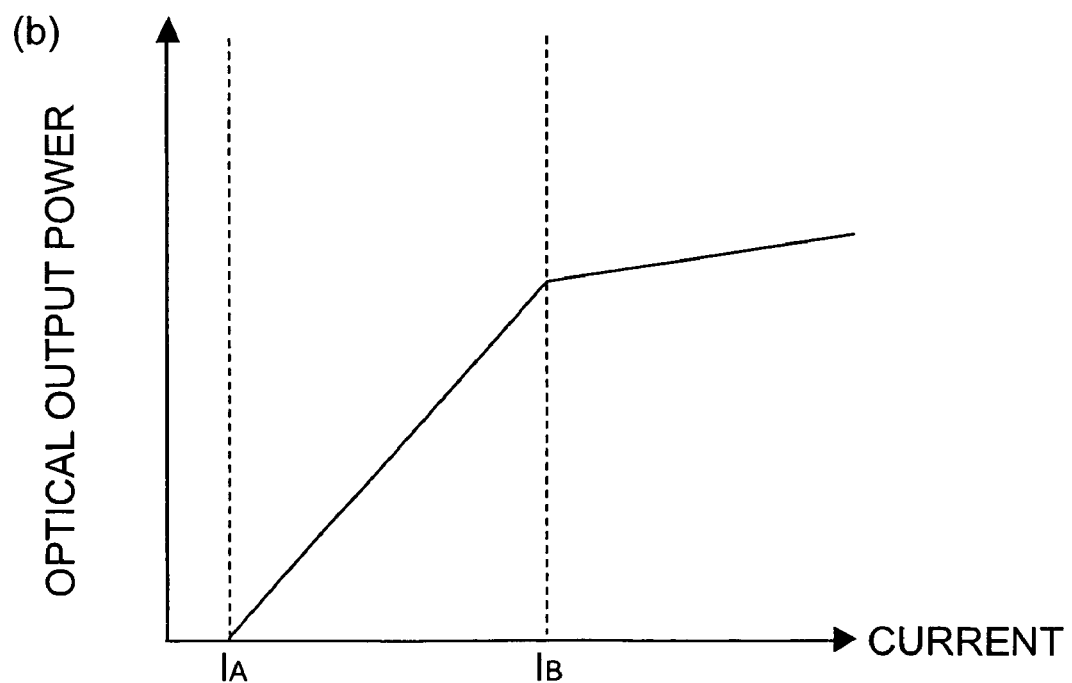

Fig.7
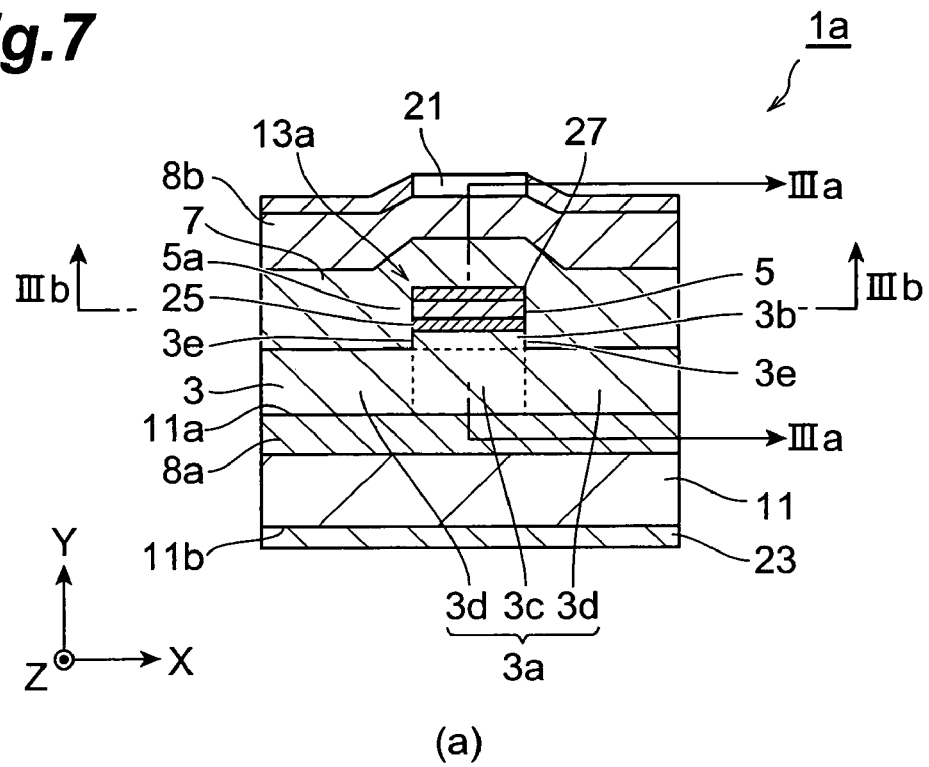
(a)
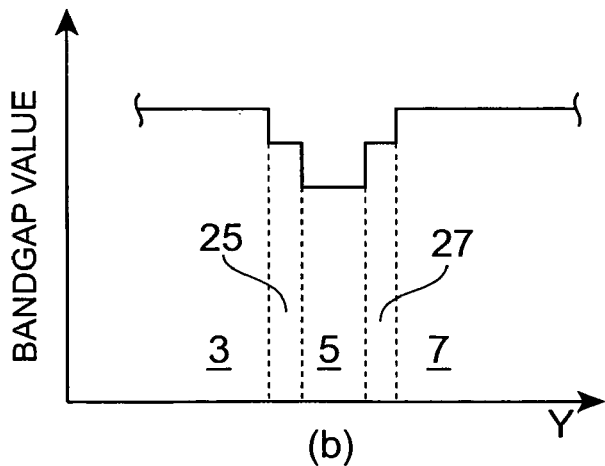
(b)
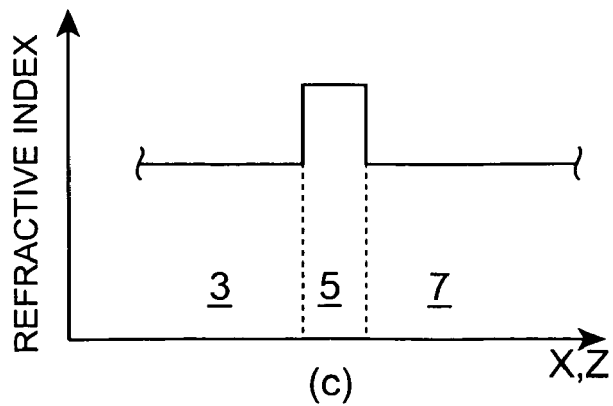
(c)

Fig.8
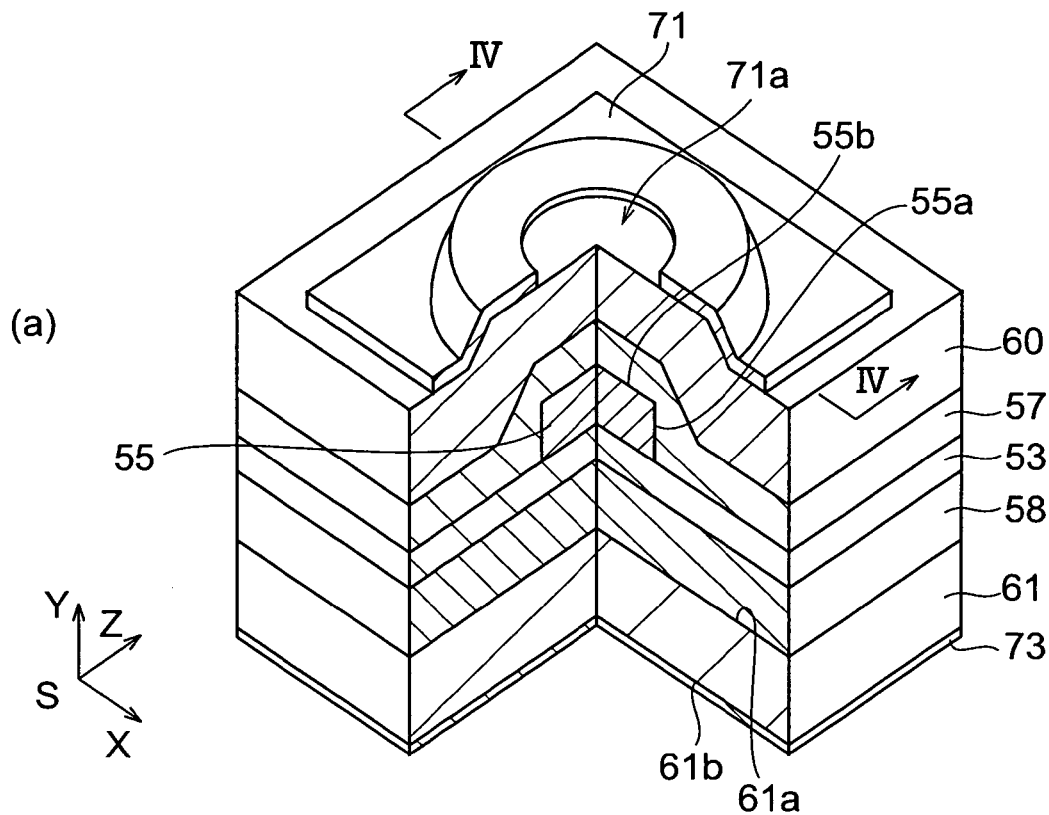
(a)
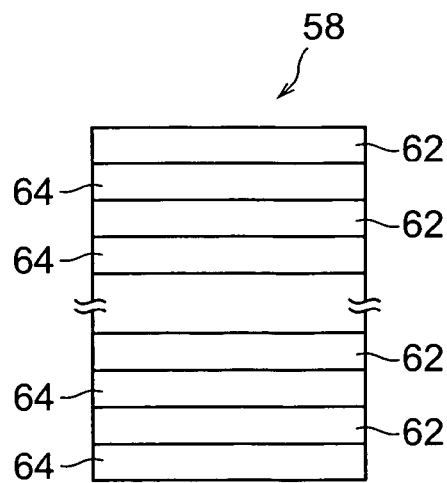
(b)
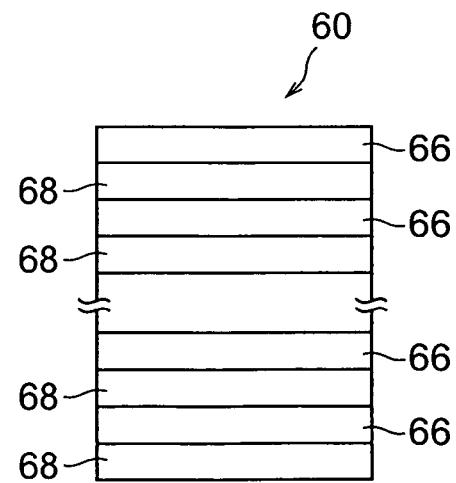
(c)

Fig.9
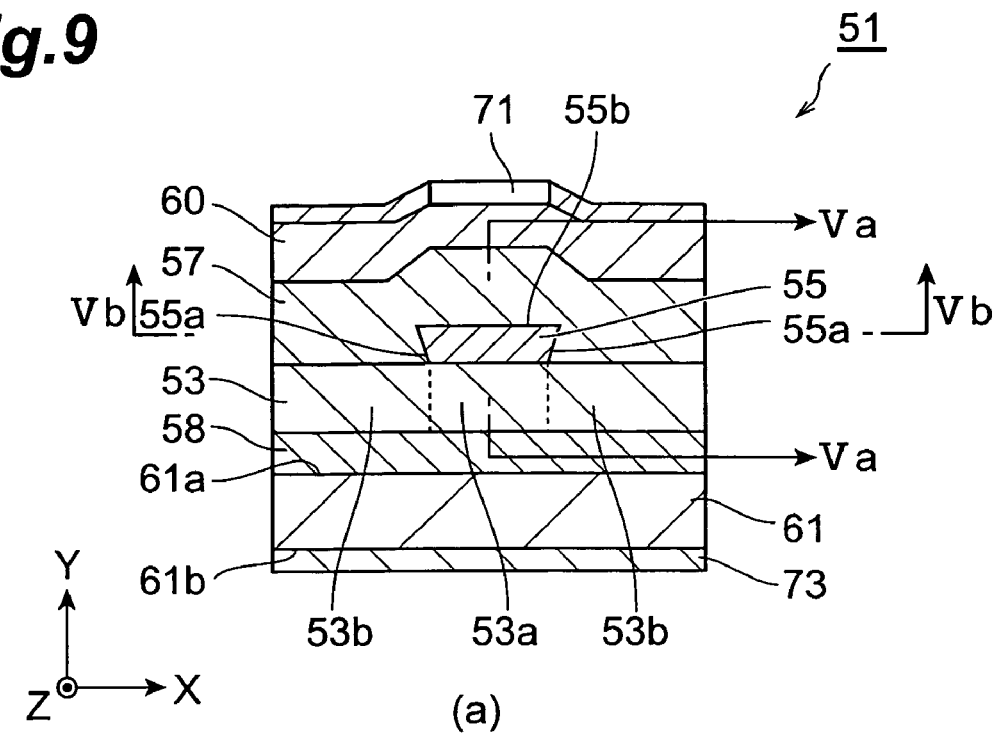
(a)
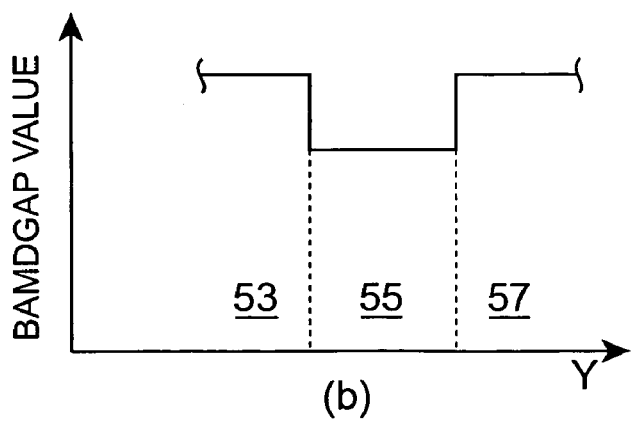
(b)
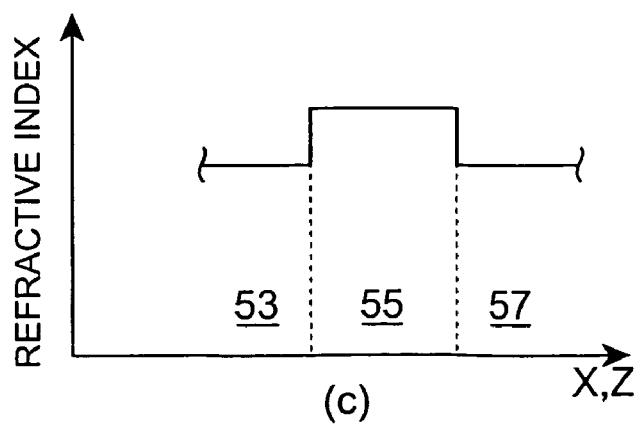
(c)

*Fig.10*
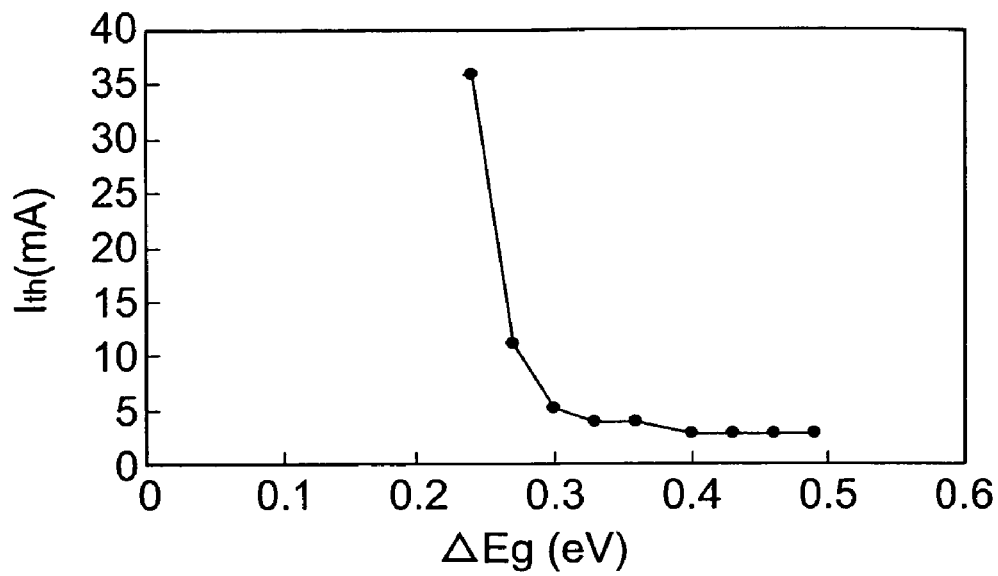
(a)
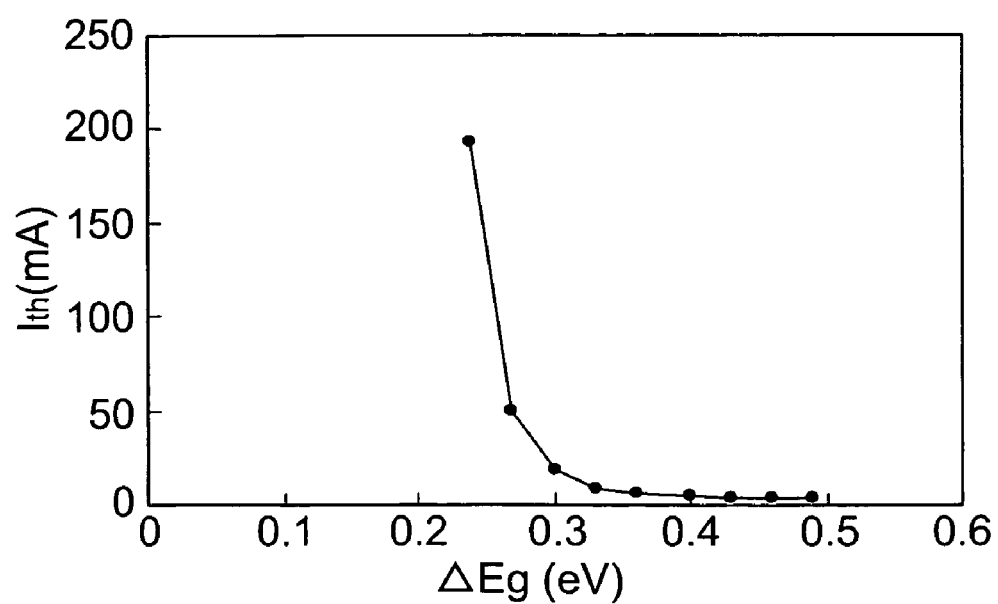
(b)

*Fig.11*

| x | Eg | ΔEg |
|---:|---:|---:|
| 0 | 1.42 | 0.49 |
| 0.025 | 1.46 | 0.46 |
| 0.05 | 1.49 | 0.43 |
| 0.075 | 1.52 | 0.40 |
| 0.1 | 1.55 | 0.36 |
| 0.125 | 1.58 | 0.33 |
| 0.15 | 1.61 | 0.30 |
| 0.175 | 1.64 | 0.27 |
| 0.2 | 1.67 | 0.24 |

Fig.12
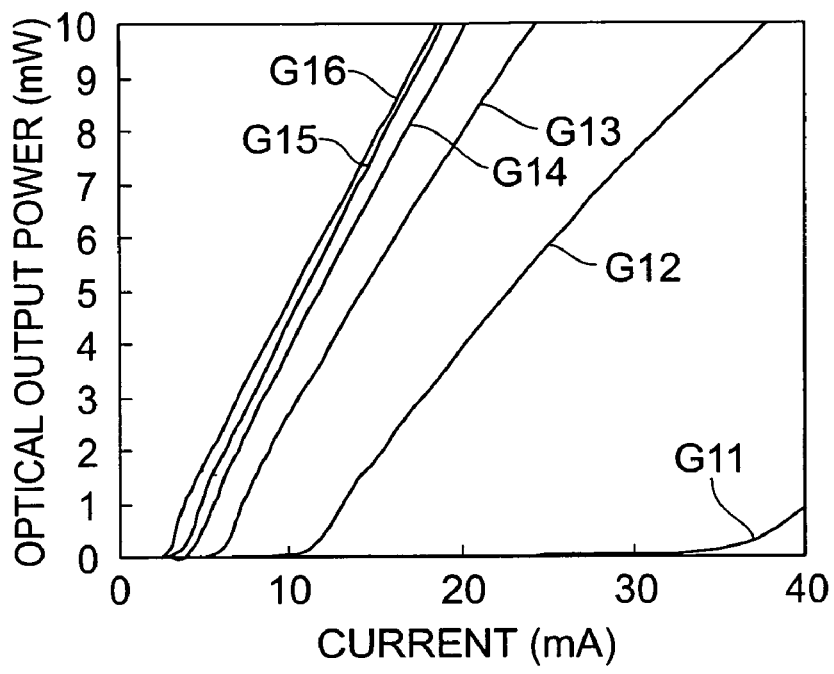
(a)
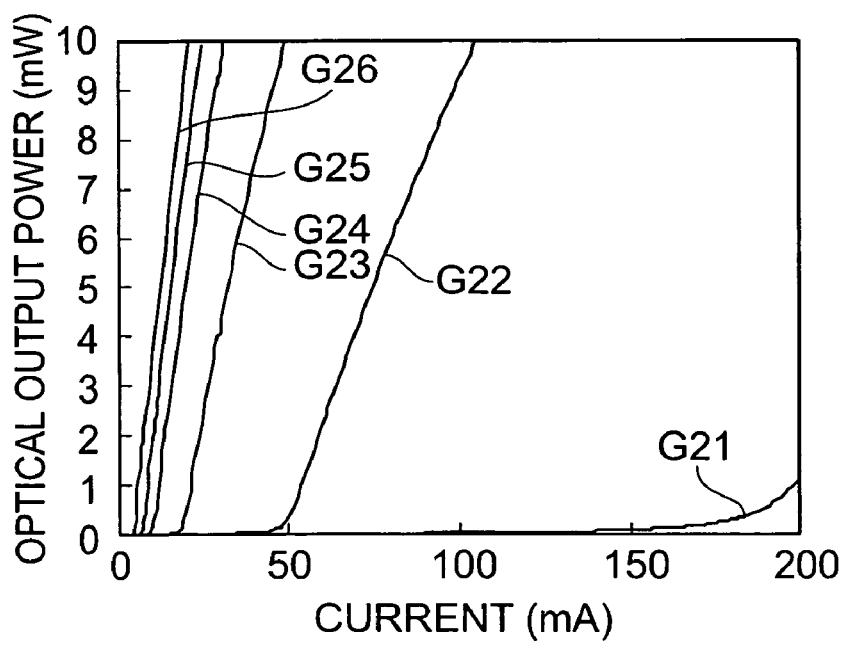
(b)

*Fig.14*

| FIRST/SECOND CONDUCTIVE TYPE SEMICONDUCTOR REGIONS | ACTIVE LAYER | SPACER LAYER |
|---|---|---|
| AlGaAs | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP<br>AlGaInP<br>GaInP | AlGaAs<br>GaAs<br>GaInAsP<br>AlGaInP<br>GaInP |
| AlGaInP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP<br>AlGaInP<br>GaInP | AlGaAs<br>GaAs<br>GaInAsP<br>AlGaInP<br>GaInP |
| GaInP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP | AlGaAs<br>GaAs<br>GaInAsP |
| GaInAsP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP | AlGaAs<br>GaAs<br>GaInAsP |

Fig.15
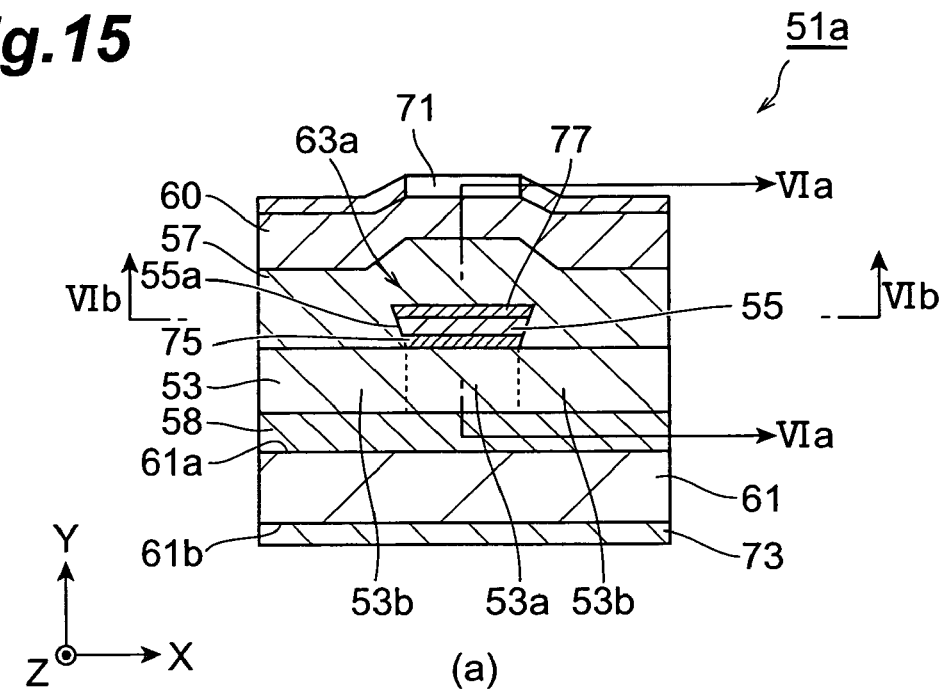
(a)
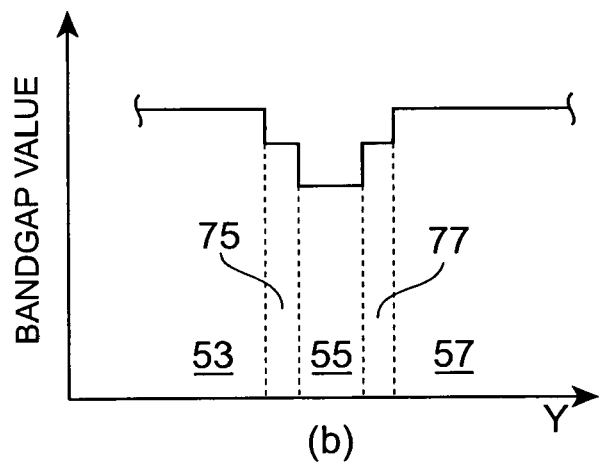
(b)
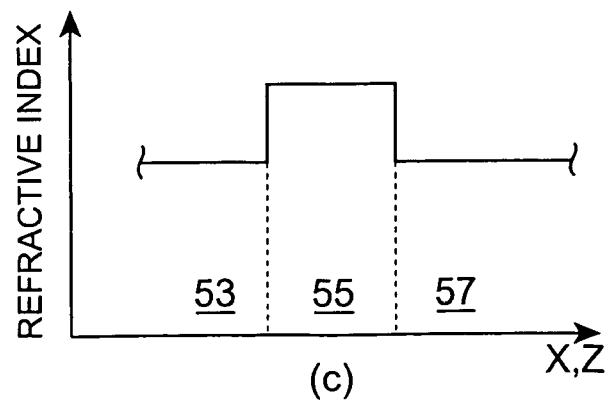
(c)

Fig.18
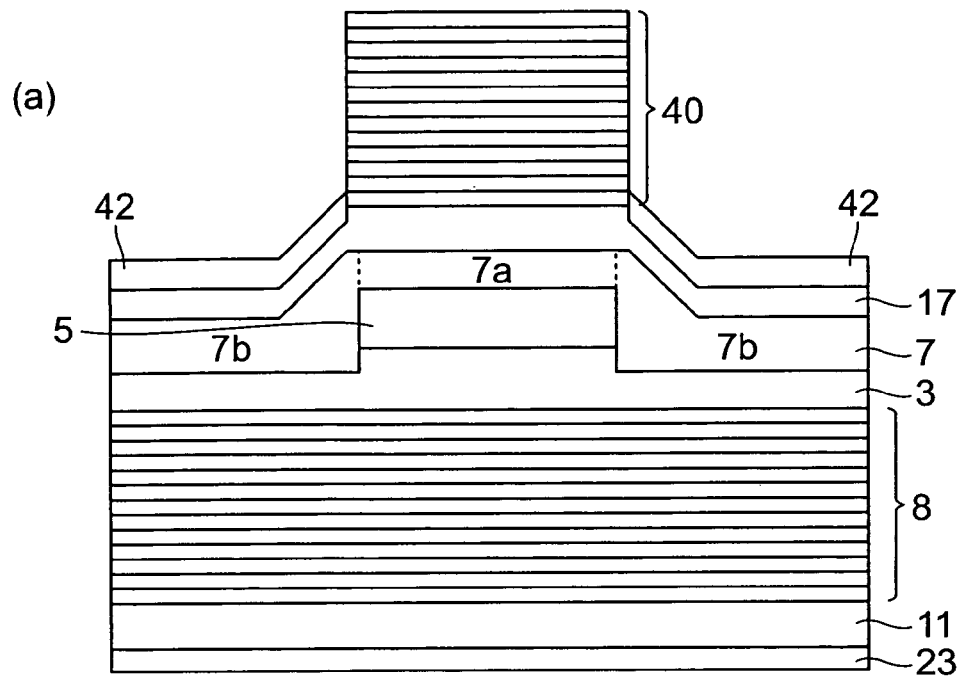
(a)
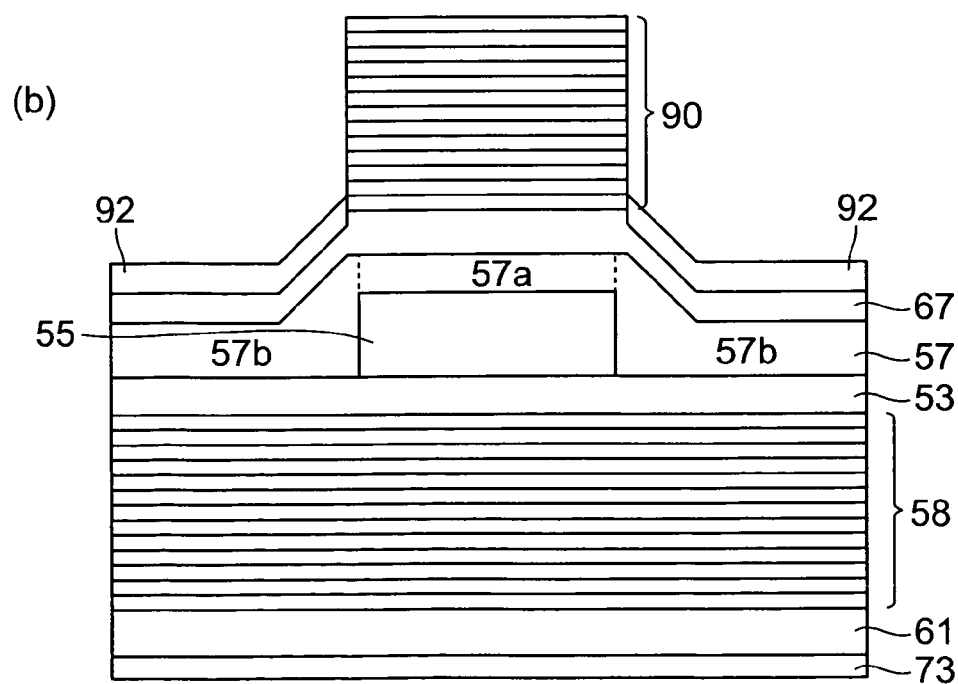
(b)

SEMICONDUCTOR OPTICAL DEVICE

BACKGROUND OF THE INVENTION

1. Field of the Invention

The present invention relates to a semiconductor optical device.

2. Related Background of the Invention

Publication 1 (IEEE JOURNAL OF QUANTUM ELECTRONICS, VOL.QE-17, NO. 2, FEBRUARY 1981, pp. 202-207) discloses a buried hetero-structure semiconductor laser. This semiconductor laser has an active layer made of GaInAsP semiconductor. This active layer is provided between a p-type InP semiconductor layer and an n-type InP semiconductor layer and is located between InP current block portions of InP semiconductor. Carriers are injected into the active layer and the injected carriers are confined into the active layer by the hetero-barriers at the interfaces between the active layer and the current block portions.

SUMMARY OF THE INVENTION

FIG. 19 shows a method of manufacturing a buried hetero-structure semiconductor laser as described above. As shown in area (a) in FIG. 19, an n-type InP semiconductor layer (n-type cladding layer) 103, a GaInAsP active layer 105, a p-type InP semiconductor layer (p-type cladding layer) 106, a protecting layer 108 are epitaxially grown on an InP substrate 111. A mask 110 for forming a waveguide structure is formed on the protecting layer 108. Then, as shown in area (b) in FIG. 19, the protecting layer 108, p-type InP semiconductor layer 106, GaInAsP active layer 105 and n-type InP semiconductor layer 103 are etched using the mask 110 to form a mesa 112 for the waveguide structure.

Then, as shown in area (c) in FIG. 19, a current block portion 109 having a p-type semiconductor layer 109a and an n-type semiconductor layer 109b is epitaxially grown on both sides of the mesa 112. Since the mask 110 is located on the top of the mesa 112 including the active layer, the current block portion 109 is not formed on the mesa 112. Next, as shown in area (d) in FIG. 19, the protecting layer 108 and the mask 110 are removed and a p-type InP semiconductor layer 107 and a p-type GaInAsP semiconductor layer (p-type contact layer) 117 are epitaxially grown thereon. An anode electrode and a cathode electrode are formed on the p-type semiconductor layer 117 and the InP substrate 111, respectively, to form the buried heterostructure semiconductor laser.

The fabrication of buried heterostructure semiconductor lasers as above requires at least three epitaxial growth steps as shown in FIG. 19. Epitaxial growth steps are complex and take long time. Therefore, it is preferable that the number of epitaxial growth steps be as small as possible.

A surface emitting semiconductor laser has an n-type InP semiconductor layer, a active GaInAsP layer and a p-type InP semiconductor layer, which are provided between two distributed Bragg reflector (DBR) portions. Each of these DBR portions is formed by alternately growing first DBR layers and second DBR layers the refractive index of which is different from that of the first DBR layers. Accordingly, processing time for epitaxial growth steps in the fabrication of the surface emitting semiconductor laser is longer as compared with buried heterostructure semiconductor lasers as shown in FIG. 19. Surface emitting semiconductor lasers are required to have a structure for confining current and surface emitting type electro-absorption optical modulators are required to have a structure for locally generating a large electric field in applying a reverse bias voltage. What is required for the surface emitting semiconductor lasers and surface emitting type electro-absorption optical modulators is to include a structure for the generation of strong electric field and the confinement of current in addition to shorten the work period.

It is an object to provide a semiconductor optical device having a simple structure capable of locally generating strong electric field when a reverse bias voltage is applied thereto and confining current when a forward bias voltage is applied thereto.

According to one aspect of the present invention, a semiconductor optical device comprises: a first conductive type semiconductor region, an active layer, a second conductive type semiconductor region, a first distributed Bragg reflector portion and a second distributed Bragg reflector portion. The first conductive type semiconductor region includes a first semiconductor portion and a second semiconductor portion. The first semiconductor portion has a first region and a second region. The first and second regions are arranged along a predetermined plane. The second semiconductor portion is provided on the first region of the first semiconductor portion. The second semiconductor portion has a side. The active layer is provided on the second semiconductor portion of the first conductive type semiconductor region. The active layer has a top and a side. A bandgap energy of the first conductive type semiconductor region is greater than that of the active layer. The second conductive type semiconductor region is provided on the second region of the first semiconductor portion of the first conductive type semiconductor region. The side of the second semiconductor portion of the first conductive type semiconductor region, the top and side of the active layer, the second region of the first conductive type semiconductor region and the second conductive type semiconductor region constitute a pn junction. A bandgap energy of the second conductive type semiconductor region is greater than that of the active layer. The first distributed Bragg reflector portion includes first distributed Bragg reflector layers and second distributed Bragg reflector layers. The first and second distributed Bragg reflector layers are arranged alternately. The second distributed Bragg reflector portion includes third distributed Bragg reflector layers and fourth distributed Bragg reflector layers. The third and fourth distributed Bragg reflector layers are arranged alternately. The first conductive type semiconductor region, the active layer and the second conductive type semiconductor region are provided between the first distributed Bragg reflector portion and the second distributed Bragg reflector layers.

According to another aspect of the present invention, a semiconductor optical device comprises: a first conductive type semiconductor region, an active layer, a second conductive type semiconductor region, a first distributed Bragg reflector portion and a second distributed Bragg reflector portion. The first conductive type semiconductor region has a first region and a second region. The first and second regions are arranged along a predetermined plane. The active layer is provided on the first region of the first conductive type semiconductor region. The active layer has a top and a side. A bandgap energy of the first conductive type semiconductor region is greater than that of the active layer. The second conductive type semiconductor region is provided on the second region of the first conductive type semiconductor region and the top and side of the active layer. A bandgap energy of the second conductive type semiconductor region is greater than that of the active layer. The second conductive type semiconductor region and the second region of the first conductive type semiconductor region constitute a pn junction. The first distributed Bragg reflector portion includes first distributed Bragg reflector layers and second distributed Bragg reflector layers. The first and second distributed Bragg reflector layers are arranged alternately. The second distributed Bragg reflector portion includes third distributed Bragg reflector layers and fourth distributed Bragg reflector layers. The third and fourth distributed Bragg reflector layers are arranged alternately. The first conductive type semiconductor region, the active layer and the second conductive type semiconductor region are provided between the first distributed Bragg reflector portion and the second distributed Bragg reflector layers.

In the semiconductor optical device according to the present invention, the first conductive type semiconductor region is made of material permitting the first conductive type semiconductor region to working as an etching stop layer for etching the active layer.

In the semiconductor optical device according to the present invention, a difference between a bandgap energy of the first conductive type semiconductor region and that of the active layer is equal to or more than $4.8 \times 10^{-20}$ Joule and a difference between a bandgap energy of the second conductive type semiconductor region and that of the active layer is equal to or more than $4.8 \times 10^{-20}$ Joule.

In the semiconductor optical device according to the present invention, the first conductive type semiconductor region is made of AlGaAs, AlGaInP, GaInP and GaInAsP. The second conductive type semiconductor region is made of AlGaAs, AlGaInP, GaInP and GaInAsP. The active layer is made of III-V compound semiconductor containing at least nitrogen.

The semiconductor optical device according to the present invention, further comprises: a second conductive type semiconductor contact layer provided on the second conductive type semiconductor region; and an electrode provided on the second conductive type semiconductor contact layer.

In the semiconductor optical device according to the present invention, the first conductive type semiconductor region includes a third region and a fourth region. The third region and the second conductive type semiconductor region constitute the pn junction. A dopant concentration of the third region is different from that of the fourth region.

In the semiconductor optical device according to the present invention, the second conductive type semiconductor region includes a first region and a second region. The first region of the second conductive type semiconductor region and the first conductive type semiconductor region constitute the pn junction. A dopant concentration of the first region of the second conductive type semiconductor region is different from that of the second region of the second conductive type semiconductor region.

The semiconductor optical device according to the present invention, further comprises: a first spacer layer provided between the active layer and the first conductive type semiconductor region; and a second spacer layer provided between the active layer and the second conductive type semiconductor region.

In the semiconductor optical device according to the present invention, the semiconductor optical device includes a semiconductor laser.

In the semiconductor optical device according to the present invention, the semiconductor optical device includes a light emitting diode.

In the semiconductor optical device according to the present invention, the semiconductor optical device includes a semiconductor optical amplifier.

In the semiconductor optical device according to the present invention, the semiconductor optical device includes an electro-absorption type modulator.

In the semiconductor optical device according to the present invention, the semiconductor optical device includes a semiconductor optical waveguide.

In the semiconductor optical device according to the present invention, the semiconductor optical device includes an integrated optical device having at least one of a semiconductor laser, a light emitting diode, a semiconductor optical amplifier, an electro-absorption type modulator and a semiconductor optical waveguide.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

FIG. 1 is a view showing a semiconductor optical device and the structures of first and second DBR portions according to the first embodiment.

FIG. 2 is a view showing the semiconductor optical device according to the first embodiment.

FIG. 4 schematically shows current vs. voltage and current vs. optical output power characteristics for the semiconductor optical device according to the first embodiment.

FIG. 7 is a view showing a modified semiconductor optical device according to the first embodiment.

FIG. 8 is a view showing a semiconductor optical device and the structures of first and second DBR portions according to the second embodiment.

FIG. 9 is a view for the semiconductor optical device according to the second embodiment.

FIG. 10 schematically shows the relationship between oscillating threshold current $I_{th}$ and bandgap difference $\Delta Eg$ between the active layer and the first conductive type semiconductor region or the second conductive type semiconductor region.

FIG. 11 is a view showing the relationship among the Al composition "x" of the active layer, the bandgap energy Eg of the active layer and the bandgap difference $\Delta Eg$.

FIG. 12 schematically shows current vs. voltage and current vs. optical output power characteristics for the bandgap energies.

FIG. 14 is a view showing the list of the combination of the semiconductor material that can be used for the semiconductor optical device according to the present invention.

FIG. 15 is a view showing another modified semiconductor optical device.

FIG. 18 is a view showing still another modified semiconductor optical device according to the second embodiment.

DESCRIPTION OF THE PREFERRED EMBODIMENTS

Figure 3:
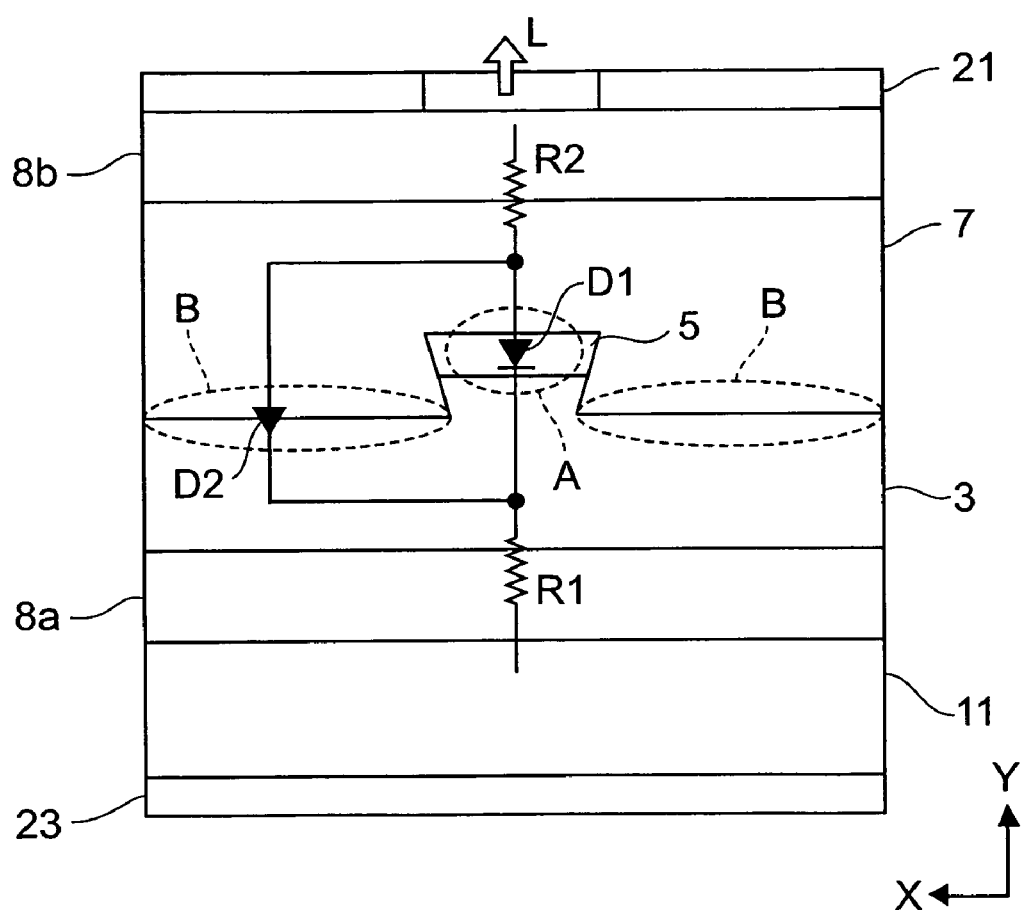
FIG. 3 is an equivalent circuit diagram showing the electrical property of the semiconductor optical device according to the first embodiment.

The teachings of the present invention will readily be understood in view of the following detailed description with reference to the accompanying drawings illustrated by way of example. When possible, parts identical to each other will be referred to with reference symbols identical to each other.

First Embodiment

Area (a) in FIG. 1 shows a perspective view showing a semiconductor optical device according to the first embodiment. An XYZ coordinate system S is depicted in area (a). Area (b) in FIG. 1 shows a structure of a first DBR portion and area (c) in FIG. 1 shows a structure of a first DBR portion. FIG. 2 is a view showing the semiconductor optical device according to the first embodiment. Area (a) in FIG. 2 shows a cross sectional view taken along I-I in FIG. 1. Area (b) in FIG. 2 shows a band diagram, taken along IIa-IIa in area (a), for the semiconductor optical device according to the first embodiment. Area (c) in FIG. 2 shows a refractive index diagram, taken along IIb-IIb in area (a), for the semiconductor optical device according to the first embodiment.

FIGS. 1 and 2 shows a semiconductor optical device 1, such as a vertical cavity surface emitting semiconductor laser. The semiconductor optical device 1 comprises a first conductive type semiconductor region 3, an active layer 5, a second conductive type semiconductor region 7, a first distributed Bragg reflector (DBR) portion 8*a* and a second distributed Bragg reflector (DBR) portion 8*b*. As shown in area (b) in FIG. 1, the first DBR portion 8*a* includes first DBR semiconductor layers 24 and second semiconductor layers 26, and the first and second semiconductor layers 24 and 26 are alternately arranged. As shown in area (c) in FIG. 1, the second DBR portion 8*b* includes third DBR semiconductor layers 28 and fourth semiconductor layers 30, and the third and fourth semiconductor layers 28 and 30 are alternately arranged. The first conductive type semiconductor region 3, the active layer 5 and the second conductive type semiconductor region 7 are provided between the first DBR portion 8*a* and the second DBR portion 8*b*. The first conductive type semiconductor region 3 is provided on the surface of GaAs and has a first semiconductor portion 3*a* and a second semiconductor portion 3*b*. As shown in FIG. 2, the first semiconductor portion 3*a* includes a first region 3*c* and a second region 3*d* which surrounds the first region 3*c*. The second semiconductor portions 3*b* is located on the first region 3*c* of the first semiconductor portion 3*a*. The first region 3*c* extends in the direction of the y-axis. The second semiconductor portion 3*b* is provided on the first region 3*c* of the first semiconductor portion 3*a* and has a side 3*e*. The active layer 5 is provided on the second semiconductor portion 3*b* of the first conductive type semiconductor region 3. The active layer 5 has a side 5*a* and a top 5*b*. The second conductive type semiconductor region 7 is provided on the second region 3*d* of the first semiconductor portion 3*a* of the first conductive type semiconductor region 3, the side 3*e* of the second semiconductor portion 3*b*, and the side 5*a* and the top 5*b* of the active layer 5. The second conductive type semiconductor region 7 and the second region 3*d* of the first semiconductor portion 3*a* of the first conductive type semiconductor region 3 form a pn junction outside the active region. The active layer 5 is made of III-V compound semiconductor.

The semiconductor optical device 1 has a simple structure permitting the local generation of a strong electric field by applying a reverse bias voltage or the confinement of current by applying a forward bias voltage.

The first conductive type semiconductor region 3 is made of III-V compound semiconductor, the bandgap of which is greater than that of the active layer 5. In other words, the photoluminescence wavelength of III-V compound semiconductor of the first conductive type semiconductor region 3 is shorter than that of the active layer 5. The second conductive type semiconductor region 7 is made of III-V compound semiconductor, the bandgap of which is greater than that of the active layer 5. In other words, the photoluminescence wavelength of III-V compound semiconductor of the second conductive type semiconductor region 7 is shorter than that of the active layer 5. A photoluminescence wavelength of semiconductor material is equal to the wavelength that corresponds to the bandgap thereof. As seen from the bandgap diagram shown in area (b) of FIG. 2, the first conductive type semiconductor region 3 and second conductive type semiconductor region 7 confine carriers to the active layer 5. Consequently, the first conductive type semiconductor region 3 works as a cladding layer of the first conductive type and the second conductive type semiconductor region 7 works as a cladding layer of the second conductive type. In the active layer 5, the confined carriers injected from the first conductive type semiconductor region 3 and second conductive type semiconductor region 7 are recombined to generate light.

As shown in the refractive index diagram of area (c) of FIG. 2, the refractive index of the first conductive type semiconductor region 3 is smaller than that of active layer 5. The refractive index of the second conductive type semiconductor region 7 is also smaller than that of active layer 5. Accordingly, the first conductive type semiconductor region 3 and the second conductive type semiconductor region 7 confine light from the active layer 5 in the active layer 5 in both x and z directions. Consequently, the first conductive type semiconductor region 3 and the second conductive type semiconductor region 7 act as optical cladding layers.

The structure of the active layer 5 may be the bulk structure of a single layer, the single quantum well structure of a single quantum well layer or the multiple quantum well structure of a plurality of well layers and barrier layers which are alternately arranged.

The semiconductor optical device 1 further comprises a semiconductor substrate 11. For example, a GaAs substrate can be used as the semiconductor substrate. GaAs substrates can provide the GaAs surface on which the first conductive type semiconductor region. The first conductive type semiconductor region 3 is provided on the primary surface 11*a* of the semiconductor substrate 11. The second semiconductor portion 3*b* of the first conductive type semiconductor region 3 has a mesa shape and the active layer 5 is provided between the second semiconductor portion 3b of the first conductive type semiconductor region 3 and the second conductive type semiconductor region 7. The second semiconductor portion 3b and the active layer 5 constitute a semiconductor mesa portion 13 shown in FIG. 1. The semiconductor mesa portion 13 extends in the y-direction. In the mesa portion 13, carriers are injected to the active layer 5 from the first conductive type semiconductor region 3 and the second conductive type semiconductor region 7.

The semiconductor optical device 1 further comprises electrodes 21 and 23. The electrode 21 is provided on the DBR portion 8b of the second conductive type and has an aperture 21a located on the semiconductor mesa portion 13. Light from the active layer 5 passes through the aperture 21a. The electrode 23 is provided on the backside 11b of the semiconductor substrate 11. If required, the semiconductor optical device 1 may includes a contact layer of the second conductive type provided on the second DBR portion 8b. The bandgap energy of the contact layer is smaller than that of semiconductor of the second DBR portion 8b. Accordingly, the contact layer and the electrode 21 can form an excellent ohmic contact therebetween. For example, p-type GaAs can be used as the contact layer.

One example of the composition of the semiconductor optical device 1 is as follows:
First conductive type semiconductor region 3:
AlGaAs, AlGaInP, GaInP, GaInAsP of n-type
Active layer 5:
Undoped (un-)GaInNAs
Second conductive type semiconductor region 7:
AlGaAs, AlGaInP, GaInP, GaInAsP of p-type
Semiconductor substrate 11:
n-type heavily-doped GaAs substrate
First DBR semiconductor portion 24: AlGaAs semiconductor
Second DBR semiconductor portion 26: GaAs semiconductor
Third DBR semiconductor portion 28: AlGaAs semiconductor
Fourth DBR semiconductor portion 26: GaAs semiconductor.

The first conductive type semiconductor region 3 and the second conductive type semiconductor region 7 can be made of material that is lattice-matched to GaAs. One or more of the semiconductors listed above can be used for the semiconductor portions 3, 5, 7, 11, 24, 26, 28 and 30.

With reference to FIGS. 3 and 4, the operation of the semiconductor optical device 1 will be described. FIG. 3 is an equivalent circuit diagram showing the electrical property of the semiconductor optical device 1 according to the first embodiment. Area (a) in FIG. 4 shows a graph representing a relationship between the driving voltage and driving current for the semiconductor optical device 1. Area (b) in FIG. 4 shows a graph representing a relationship between the driving current and the optical output (optical power) for the semiconductor optical device 1. Since the bandgap energies of the first and second conductive type semiconductor regions 3 and 7 are greater than the bandgap energy of the active layer 5, the built-in potential of the pn junction (B portion in FIG. 3) constituted by the first conductive type semiconductor region 3 and the second conductive type semiconductor region 7 is greater than that of the pin junction (A portion in FIG. 3) constituted by the first conductive type semiconductor region 3, the active layer 5 and the second conductive type semiconductor region 7. Consequently, the pn junction in the B portion has a higher turn-on voltage and the pin junction in the A portion has a lower turn-on voltage. Therefore, when the driving voltage is between the turn-on voltages of the A portion and the B portion, only the A potion turns on and forward current flows exclusively through the A portion.

As shown in FIG. 3, the equivalent circuit of the semiconductor optical device 1 includes diodes D1 and D2 connected in parallel, which are formed in the A and B portions, respectively. The turn-on voltage $V_A$ (shown area (a) of FIG. 4) of the diode D1 is determined by the built-in potential in the A portion, and mainly depends on the bandgap energy of the active layer 5. The turn-on voltage $V_B$ of the diode D2 is determined by the built-in potential in the B portion, and mainly depends on the bandgap energies of the first and second conductive type semiconductor region 3 and 7. Since the built-in potential of the B portion is higher than that of the A portion, the turn-on voltage $V_B$ of the diode D2 is greater than the turn-on voltage $V_A$ of the diode D1. The greater the difference between the built-in potentials of the B portion and the A portion is, the greater the difference between the turn-on voltages $V_A$ and $V_B$ is. That is, the greater the bandgap difference between the active layer 5 and the first and second conductive type semiconductor regions 3 and 7 is, the greater the difference between the turn-on voltages $V_A$ and $V_B$ is. Symbol R1 in FIG. 3 indicates an equivalent resistor in the first conductive type semiconductor region 3, 8a and 11, and symbol R2 in FIG. 3 indicates an equivalent resistor in the second conductive type semiconductor region 7 and 8b.

As shown in area (a) in FIG. 4, when a driving voltage is applied across the electrodes 21 and 23, the diode D1 turns on at the turn-on voltage $V_A$, whereby the resistance of the A portion is lowered and the forward current $I_A$ flows therethrough. Many carriers are supplied to the active layer 5 and these carriers are recombined to generate light. Semiconductor lasers having normal values of cavity loss and internal loss start to oscillate at current slightly greater than current $I_A$ and this current $I_A$ is equivalent to the semiconductor laser threshold current thereof. When the injected current is increased over the threshold current, the optical output power is rapidly increased. The diode D2 in the B portion does not turn on yet and the resistance in the B portion is still high. Therefore, the B portion functions as a current blocking region and thus this current is confined into the A portion (the active layer 5). Besides, since the refractive index of the active layer 5 is greater than the refractive indices of the first and second conductive type semiconductor regions 3 and 7, light generated in the active layer 5 is confined into the active layer 5 and its neighborhood. In this operation in which the diode D1 turns on and the diode D2 does not turn on as described above, the confinement of both current and light is achieved and the following contributions are provided: the effective stimulated emission is caused in the active layer to generates light; the threshold current is low; and the optical power increases in linearly proportion to the amount of the injected current.

When the applied voltage reaches the turn-on voltage $V_B$, the diode D2 turns on. The resistance of the B portion becomes low and the applied current flows into the B portion in addition to the A portion. The B portion of low resistance increases leakage current that does not flow through the active layer 5. Therefore, when the driving current exceeds the current $I_B$ corresponding to the turn-on voltage $V_B$, the leakage current that does not contribute to the stimulated emission becomes large and thus the slope efficiency becomes low. As a result, the operation region in which the supplied current is greater than the current $I_B$ becomes an output saturation region in which the output power does not increase linearly with current and the relationship between the output power and the injected electrical power is non-linear. If the linear relationship between the current and the output power is needed, then the voltage below the turn-on voltage $V_B$ should be applied thereto.

The surface emitting semiconductor optical device of the above structure has the following advantages: the crystal growth process becomes simple because of two epitaxial growth steps used to fabricate the surface emitting semiconductor optical device and thus the fabrication cost becomes low; the upper DBR is formed without any crystal growth step for burying by use of a mask that may cause abnormal crystal growth and thus high quality DBR can be formed; the position and shape of the aperture can be controlled by use of photolithography; and the peering-off of films due to aluminum oxidation can be improved and thus the reliability of the semiconductor optical device becomes high.

Figure 5:
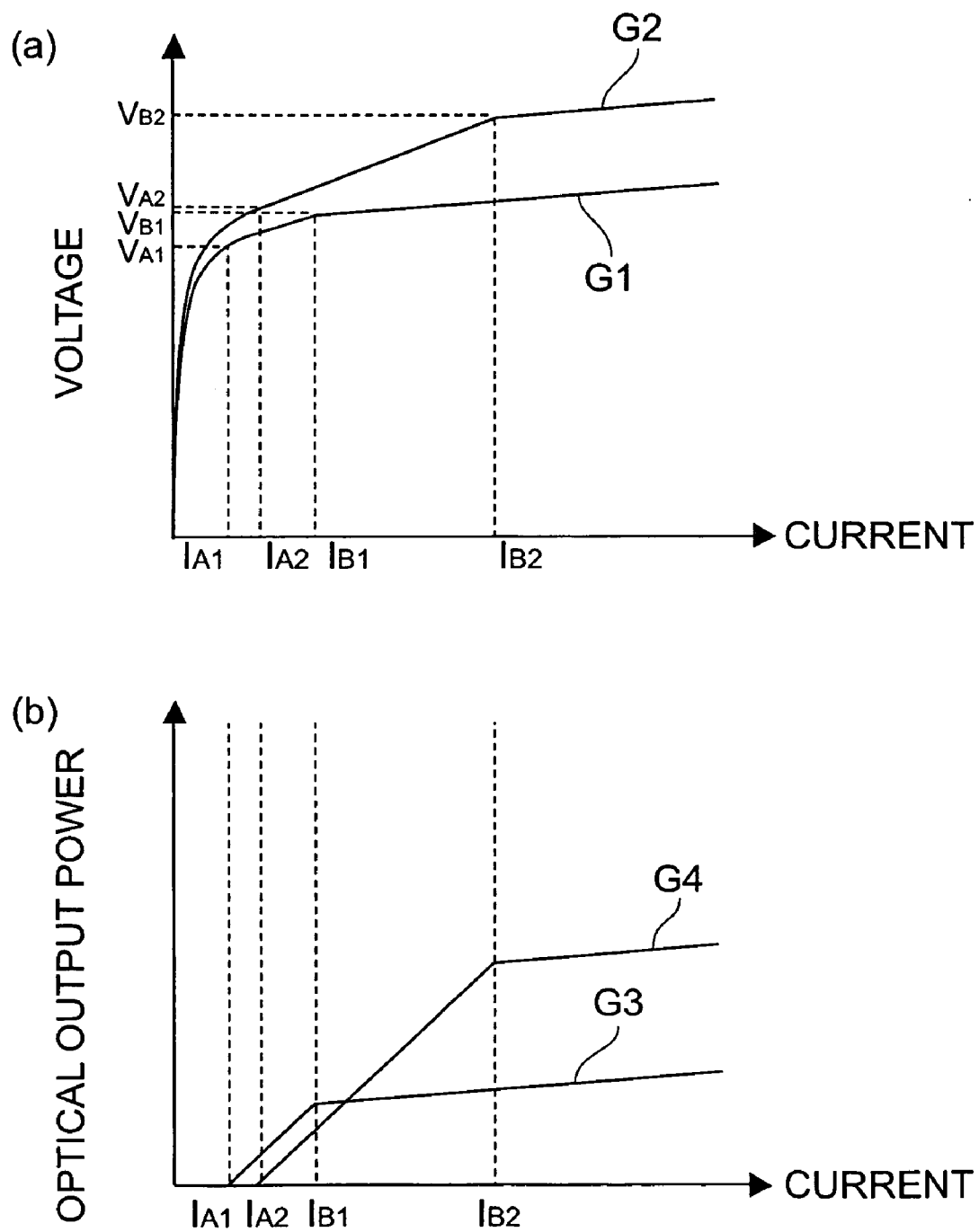
FIG. 5 is a schematic view for explaining dependence of the width of the linear operation region on the bandgap difference between the first and second conductive type semiconductor regions and the active layer for the semiconductor optical device according to the first embodiment.

Areas (a) and (b) in FIG. 5 show graphs for explaining dependence of the width of the linear operation region on the bandgap difference between the first and second conductive type semiconductor regions 3 and 7 and the active layer 5. Curve G1 in area (a) represents current vs. voltage characteristic in which the turn-on voltage in the A portion is $V_{A1}$ and the turn-on voltage in the B portion is $V_{B1}$. Curve G2 in area (a) represents current vs. voltage characteristic in which the turn-on voltage in the A portion is $V_{A2}$ and the turn-on voltage in the B portion is $V_{B2}$. In the graph in area (a), the following condition is satisfied: $V_{B2}-V_{A2}>V_{B1}-V_{A1}$. Curves G3 and G4 in area (b) represent the current vs. optical output power characteristics corresponding to the Curve G1 and G2.

Curves G2 and G4 in areas (a) and (b) in FIG. 5 show that the linear operation region defined by both current $I_{A2}$ corresponding to the turn-on voltage $V_{A2}$ and current $I_{B2}$ corresponding to the turn-on voltage $V_{B2}$ becomes wide if the bandgap difference (the turn-on voltage difference) between the active layer 5 and the first and second conductive type semiconductor regions 3 and 7 is large. On the other hand, curves G1 and G3 show that the linear operation region defined by both current $I_{A1}$ corresponding to the turn-on voltage $V_{A1}$ and current $I_{B1}$ corresponding to the turn-on voltage $V_{B1}$ becomes narrow if the bandgap differences (the turn-on voltage difference) between the active layer 5 and the first and second conductive type semiconductor regions 3 and 7 are small. As the difference between the turn-on voltage $V_A$ and the turn-on voltage $V_B$ becomes larger, the linear operation region becomes wider. Accordingly, it is preferable that the bandgap difference between the active layer 5 and the first and second conductive type semiconductor regions 3 and 7 be large.

Figure 6:
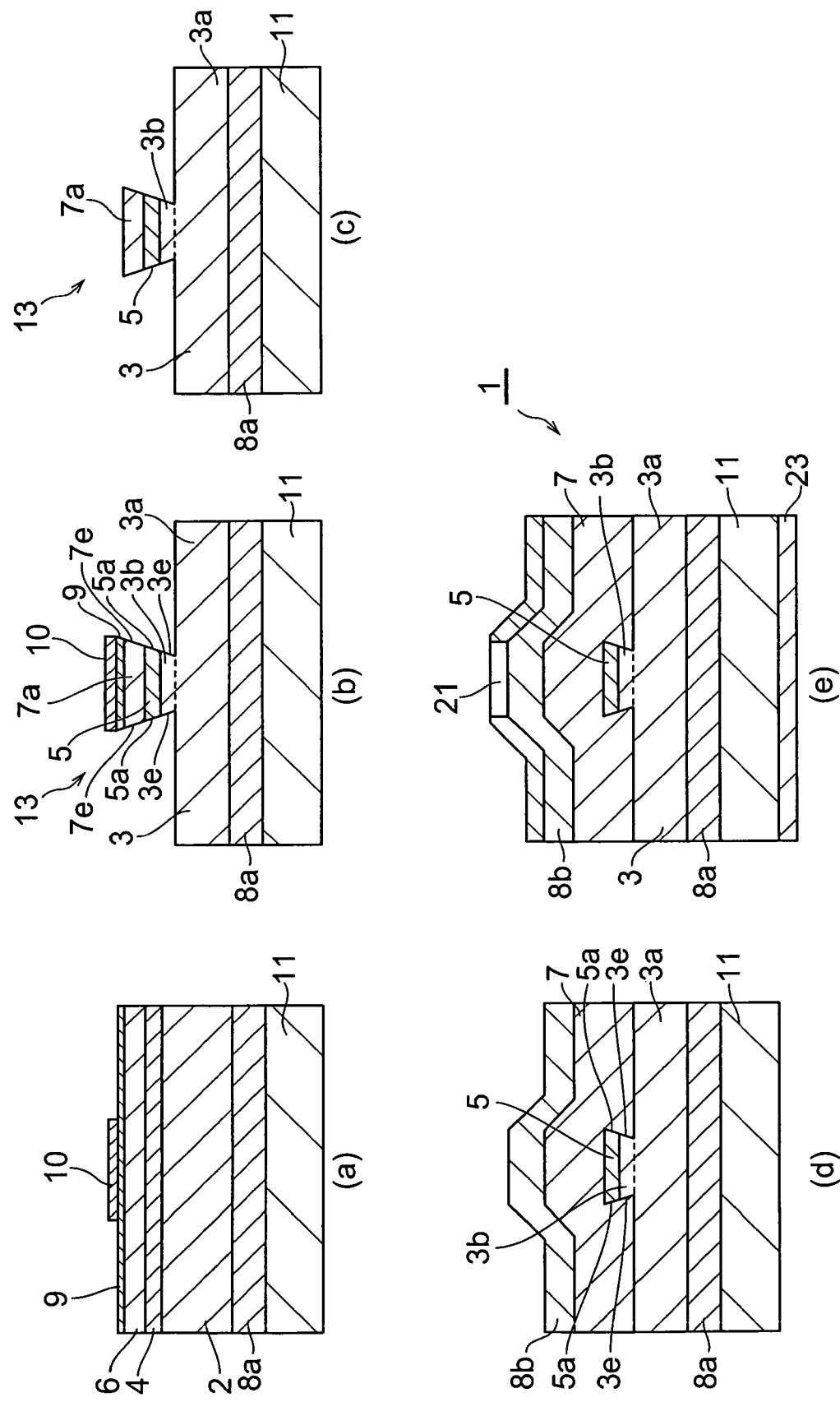
FIG. 6 is a view for explaining the fabrication of the semiconductor optical device.

With reference to FIG. 6, the fabrication of the semiconductor optical device will be explained. As shown in area (a) in FIG. 6, a first conductive type semiconductor layer 2, a first DBR portion 8a, an active layer 4, a second conductive type semiconductor layer 6 and a protect layer 9 are grown on the semiconductor substrate 11 made of GaAs (the first crystal growth step). The above layers can be grown using Organo-Metallic Vapor Phase Epitaxy (OMVPE) method or Molecular Beam Epitaxy (MBE) method, for example. Then, an etching mask 10 is formed on the protect layer 9 for forming a mesa-shaped semiconductor ridge portion 13. For example, the material of the etching mask 10 can be made of insulator, such as SiN or $SiO_2$.

As shown in area (b) of FIG. 6, the protect layer 9, the second conductive semiconductor layer 6, the active layer 4, the first conductive type semiconductor layer 2 are partially etched using the etching mask 10 by wet etching or dry etching to form the second conductive semiconductor layer 7a, the side of 5a of the active layer 5 and the side 3e of the second semiconductor portion 3b of the first conductive type semiconductor region 3. After the etching, the side 7e of the second conductive semiconductor layer 7a, the side 5a of the active layer 5 and the side 3e of the second semiconductor portion 3b of the first conductive type semiconductor region 3 are formed. The semiconductor mesa portion 13 includes the active layer 5 and the semiconductor portion 3b. Area (b) in FIG. 6 shows the semiconductor ridge portion 13 that has an inverted-mesa shape. If the crystal axis along which the mesa extends and etchant therefor can be selected properly, then the etching is carried out to form another shape of the semiconductor ridge portion 13.

As shown in area (c) of FIG. 6, the etching mask 10 and protect layer 9 are removed. As shown in area (d) of FIG. 6, the remaining portion of the second conductive type semiconductor region 7 is grown and then the second DBR portion 8b is grown thereon (the second crystal growth). The electrodes 21 and 23 are, finally, formed on the second DBR portion 8b and the backside of the semiconductor substrate 11, respectively, to complete the semiconductor optical device 1.

Figure 19:
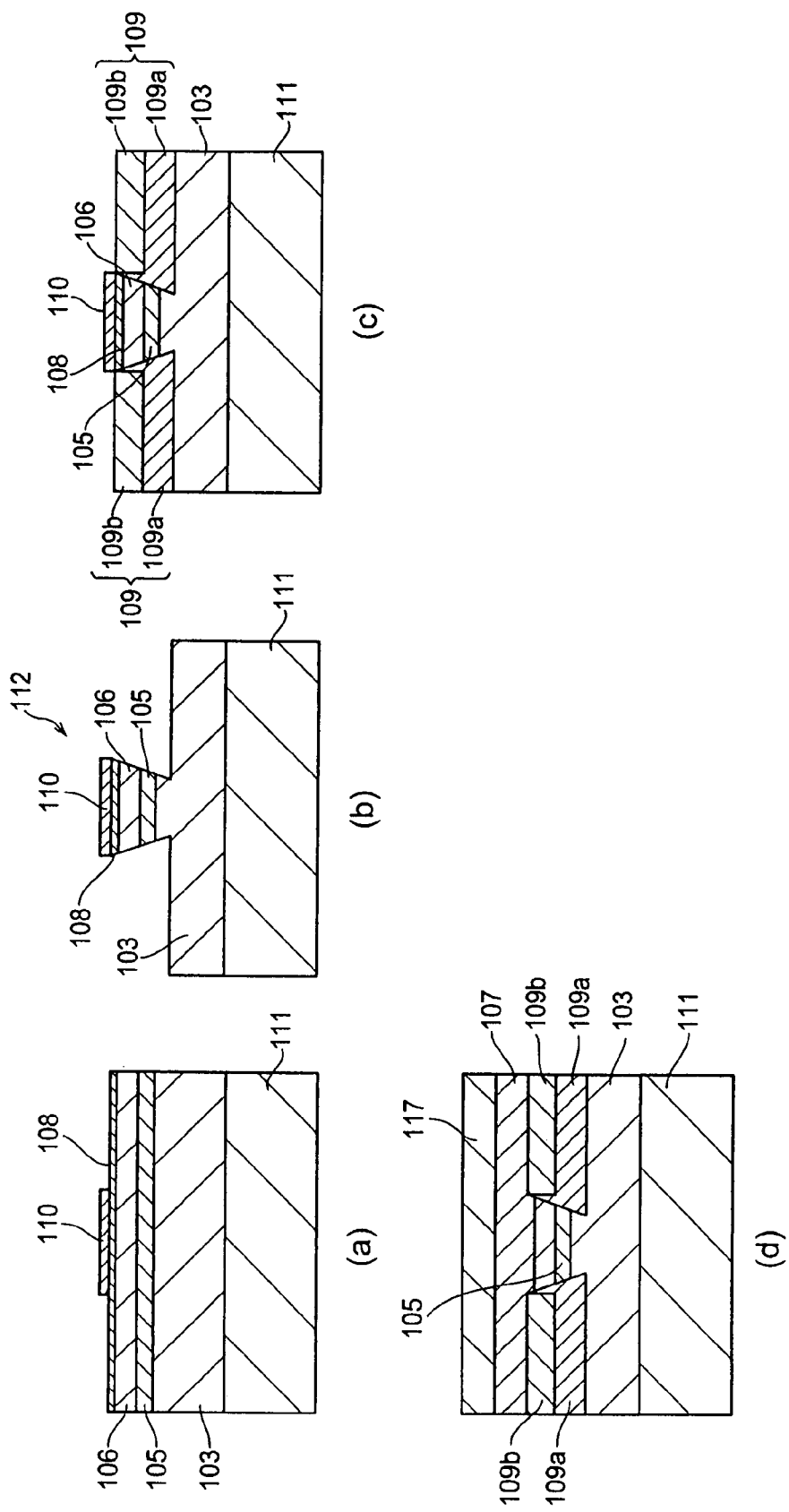
FIG. 19 is a view showing an example of the steps for fabricating a buried heterostructure semiconductor laser.

The semiconductor optical device 1 does not need the current block portion as used in buried heterostructure semiconductor lasers in FIG. 19. As seen from the foregoing explanations, the step of growing the current block portion is not needed in the fabrication of the semiconductor optical device according to the present embodiment, as compared to the fabrication of the buried heterostructure semiconductor lasers shown in FIG. 19. Therefore, the semiconductor optical device permits the yield improvement and cost reduction because the number of the epitaxial growth steps is reduced (twice in the present embodiment).

Area (a) of FIG. 18 shows a semiconductor optical device including a second DBR portion 40. The second DBR portion 40 may be located mainly on the first region 3c of the first conductive type semiconductor portion 3. The first portion 7a of the second conductive type semiconductor portion 7 is located between the second DBR portion 40 and the active layer 5 and thus the second DBR portion 40 can be formed on the planar semiconductor region. An electrode 42 is located on a second region 7b of the second conductive type semiconductor portion 7 and the second region 7b is provided to surround the first region 7a. A contact layer 17 is provided on the first region 7a of the second conductive type semiconductor portion 7 as well as between the electrode 42 and the second region 7b of the second conductive type semiconductor portion 7. That is, the contact layer 17 is provided between the second DBR portion and the second conductive type semiconductor region 7. Since the contact layer 17 is located on both first and second region 7a and 7b of the second conductive type semiconductor portion 7, carriers from the electrode 42 flow through the contact layer 7 into the active layer 5. Therefore, the effective resistance between the active layer 5 and the electrode 42 becomes small.

In buried heterostructure semiconductor optical devices as shown in, for example, Publication 1, the injected carriers are blocked by the current blocking region having a pn junction constituted by a p-type semiconductor layer and an n-type semiconductor layer which are inversely biased. However, in the laser of this type, a plurality of pn junctions should be formed to realize a current blocking, which leads to a large parasitic capacitance, and prevents the high-speed operation of the buried heterostructure semiconductor optical devices. On the other hand, since the semiconductor optical device according to the present embodiment blocks the injected carriers by use of the single pn junction, biased forwardly, constituted by the first and second conductive type semiconductor regions 3 and 7, only one pn junction is needed for current blocking and thus the capacitance is decreased compared with the conventional buried heterostructure semiconductor optical devices. Therefore, the semiconductor optical device 1 can operate at higher speed.

As described above, the surface of GaAs semiconductor can be provided by GaAs substrates. Since available GaAs substrates are large-sized such as 6 inch in a diameter and are high quality and inexpensive, the productivity improvement and cost reduction of the semiconductor optical device 1 are achieved and large-scaled integration including the semiconductor optical device 1 can be realized easily.

FIG. 7 is a view showing a modified semiconductor optical device 1a according to the present embodiment. Area (a) in FIG. 7 shows a cross sectional view. Area (b) in FIG. 7 shows a band diagram, taken along IIIa-IIIa in area (a), for the modified semiconductor optical device 1a. Area (c) in FIG. 7 shows a refractive index diagram, taken along IIIb-IIIb in area (a), for the modified semiconductor optical device 1a. The semiconductor optical device 1a further comprises a first spacer layer 25 and a second spacer layer 27. The first spacer layer 25 is provided between the first conductive type semiconductor region 3 and the active layer 5. The second spacer layer 27 is provided between the second conductive type semiconductor region 7 and the active layer 5. The second semiconductor portion 3b of the first conductive type semiconductor region 3, the active layer 5, the first spacer layer 25 and the second spacer layer 27 constitute a semiconductor mesa portion 13a.

The first spacer layer 25 is made of material having a bandgap energy between that of the first conductive type semiconductor region 3 and that of the active layer 5. The second spacer 27 is made of material having a bandgap energy between that of the second conductive type semiconductor region 7 and that of the active layer 5. Carriers are injected into the active layer 5 from the first and second conductive type semiconductor regions 3 and 7 through the first and second spacer layers 25 and 27. As shown in area (b) of FIG. 7, the injected carriers in the modified semiconductor optical device 1a are confined into the active layer 5 by the first and second spacer layers 25 and 27.

The first separation layer 25 and the second separation layer 27 enable the efficient confinement of current, and enhance the confinement of current, leading to improvements of lasing characteristics such as a threshold current, reduction and a less dependence on temperature. If the active layer 5 has a quantum well structure constituted by thin films, the optical confinement factor is small. But, by introducing the first and second separation layers 25 and 27, the optical confinement performance of the quantum well structure increases significantly, thereby drastically improving the oscillation characteristics.

Second Embodiment

Area (a) in FIG. 8 is a perspective view showing a semiconductor optical device according to the second embodiment. Area (b) in FIG. 8 shows a structure of a first DBR portion and area (c) in FIG. 8 shows a structure of a first DBR portion. An XYZ coordinate system S is depicted in FIG. 8. FIG. 9 is a view for the semiconductor optical device according to the second embodiment. Area (a) in FIG. 9 shows a cross sectional view taken along IV-IV in FIG. 8. Area (b) in FIG. 9 shows a band diagram, taken along Va-Va in area (a), for the semiconductor optical device according to the second embodiment. Area (c) in FIG. 9 shows a refractive index diagram, taken along Vb-Vb in area (a), for the semiconductor optical device according to the second embodiment. FIGS. 8 and 9 shows a semiconductor optical device 51, such as a semiconductor laser.

The semiconductor optical device 51 comprises a first conductive type semiconductor region 53, an active layer 55, a second conductive type semiconductor region 57, a first DBR portion 58 and a second DBR portion 60. As shown in area (b) of FIG. 8, the first DBR portion 58 includes first DBR layers 62 and second DBR layers 64, and the first and second DBR layers 62 and 64 are alternately arranged. As shown in area (c) of FIG. 8, the second DBR portion 60 includes third DBR layers 66 and fourth DBR layers 68, and the third and fourth DBR layers 66 and 68 are alternately arranged. The first conductive type semiconductor region 53, the active layer 55 and the second conductive type semiconductor region 57 are provided between the first DBR portion 58 and the second DBR portion 60. The first conductive type semiconductor region 53 is provided on the surface of a GaAs substrate and has a first region 53a and a second region 53b provided to surround the first region 53a. The first region 53a extends in the y-direction. The active layer 55 is provided on the first region 53a of the first conductive type semiconductor region 53. The active layer 55 has a side 55a. The second conductive type semiconductor region 57 is provided on the second region 53b of the first conductive type semiconductor region 53, and the side 55a and top 55b of the active layer 55. The second conductive type semiconductor region 57 and the second region 53b of the first conductive type semiconductor region 53 form a pn junction. The active layer 55 is made of III-V compound semiconductor.

The first conductive type semiconductor region 53 is made of III-V compound semiconductor, the bandgap of which is greater than that of the active layer 55. The second conductive type semiconductor region 57 is made of III-V compound semiconductor, the bandgap of which is greater than that of the active layer 55. As seen from the bandgap diagram shown in area (b) of FIG. 9, the first conductive type semiconductor region 53 and second conductive type semiconductor region 57 confine carriers to the active layer 55. Consequently, the first conductive type semiconductor region 53 works as a cladding layer of the first conductive type and the second conductive type semiconductor region 57 works as a cladding layer of the second conductive type. In the active layer 55, the confined carriers injected from the first conductive type semiconductor region 53 and the second conductive type semiconductor region 57 are recombined to generate light.

As shown in area (c) of FIG. 9, the refractive index of the first conductive type semiconductor region 53 is smaller than that of active layer 55. The refractive index of the second conductive type semiconductor region 57 is also smaller than that of active layer 55. Accordingly, the first conductive type semiconductor region 53 and the second conductive type semiconductor region 57 confine light from the active layer 55 in the active layer 55 in both x and y directions. Consequently, the first conductive type semiconductor region 53 and the second conductive type semiconductor region 57 act as optical cladding layers.

The structure of the active layer 55 may be the bulk structure of a single layer, the single quantum well structure of a single quantum well layer and the multiple quantum well structure of a plurality of well layers and barrier layers which are alternately arranged.

The semiconductor optical device 51 further comprises a semiconductor substrate 61. For example, GaAs substrates can be used as the semiconductor substrate 61. On the primary surface 61a of the semiconductor substrate 61, the first conductive type semiconductor region 53 is provided. The materials of the first and second DBR layers 24 and 26 can be used for materials of the first and second DBR layers 62 and 64. The materials of the third and fourth DBR layers 28 and 30 can be used for materials of the third and fourth DBR layers 62 and 64.

The semiconductor optical device 51 further comprises electrodes 71 and 73. The electrode 71 is provided on the second DBR portion 60 of the second conductive type and has an aperture 71a that light from the active layer passes through. The electrode 73 is provided on the backside 61b of the semiconductor substrate 61. If required, the semiconductor optical device 51 may further comprise a contact layer and the bandgap of the contact layer is smaller than that of the semiconductor conductive type semiconductor layer 57. Accordingly, the contact layer and the electrode 71 can form an excellent ohmic contact therebetween. Material of the contact layer is, for example, p type GaAs.

In the semiconductor optical device 51, since the first conductive type semiconductor region 53 and the second conductive type semiconductor region 57 each has a bandgap energy greater than that of the bandgap of the active layer 55, the built-in potential of the pn junction constituted by the first conductive type semiconductor region 53 and the second conductive type semiconductor region 57 is greater than that of the pin junction constituted by the first conductive type semiconductor region 53, the active layer 55 and the second conductive type semiconductor region 57. Therefore, the semiconductor optical device 51 has an equivalent circuit as in FIG. 3 and operates in the same manner as the semiconductor optical device 1. Namely, carriers from the first conductive type semiconductor region 53 and the second conductive type semiconductor region 57 are blocked by the pn junction constituted by the first conductive type semiconductor region 53 and the second conductive type semiconductor region 57, and are exclusively injected and confined into the active layer 55. Thus, the semiconductor optical device 51 is effective in confining the carriers into the active layer 55.

The method of fabricating the semiconductor optical device 51 is different from the method of fabricating the semiconductor optical device 1 (FIG. 6) in the following: the method of fabricating the semiconductor optical device 51 does not include the etching of the first conductive type semiconductor region 53 in the etching process shown in area (b) of FIG. 6. This method does not include the growth of the current block portion (as shown in area (c) in FIG. 19) and thus the number of epitaxial growth steps is decreased like the case of the semiconductor optical device 1.

In the semiconductor optical device shown in area (b) of FIG. 18, a second DBR portion 90 is located only on the active layer 55 provided on the first region 53c of the first conductive type semiconductor region 53 and the first region 57a of the second conductive type semiconductor region 57 is located between the second DBR portion 90 and the active layer 55. Accordingly, the second DBR portion 90 is formed on the planar semiconductor region. The contact layer is provided on the first region 57a pf the second conductive type semiconductor region 57 as well as between the second region 57b of the second conductive type semiconductor region 57 and the electrode 92. That is, the contact layer is also provided between the second DBR portion 90 and the second conductive type semiconductor region 57. Since the contact layer is provided on the first and second regions 57a and 57b of the second conductive type semiconductor region 57, carriers fro the electrode flow through the contact layer to the active layer. The substantial resistance between the active layer 55 and the electrode 92 becomes small.

Since the semiconductor optical device 51 according to the present embodiment blocks the injected carriers by use of the single pn junction which is biased forwardly and is constituted by the first and second conductive type semiconductor regions 53 and 57, only one pn junction is needed for current blocking and thus the capacitance is decreased compared with the conventional buried heterostructure semiconductor optical devices. Therefore, the semiconductor optical device 51 can operate at high speed.

As described above, the surface of GaAs semiconductor can be provided by GaAs substrates. Since available GaAs substrates are large-sized such as six inches in a diameter and are high quality and inexpensive, the productivity improvement and cost reduction of the semiconductor optical device 51 are achieved and large-scaled integration of the semiconductor optical device 51 can be easily realized.

The inventors have found that the present structure can improve the temperature characteristics of the semiconductor optical device 51. FIG. 10 shows calculated results of threshold current dependence on bandgap difference $\Delta Eg$ for a modified semiconductor optical device according to the present embodiment. Areas (a) and (b) in FIG. 10 show graphs representing a relationship between the oscillating threshold current $I_{th}$ and the bandgap difference $\Delta Eg$ between the first and second conductive type semiconductor regions 53, 57 and the active layer 55. The graph in area (a) of FIG. 10 shows data calculated at the device temperature of 25 Celsius degree, and the graph in area (b) of FIG. 10 shows data calculated at the device temperature of 85 Celsius degree. The material of the first and second conductive type semiconductor layers 53 and 57 can be $Ga_{0.51}In_{0.49}P$ and the active layer 55 can be made of an $Al_xGa_{1-x}As$ single film. The bandgap Eg of $Al_xGa_{1-x}As$ of the active layer 55 is changed as shown in FIG. 11 and the bandgap difference $\Delta Eg$ is adjusted by changing the bandgap Eg.

As shown in areas (a) and (b) of FIG. 10, if the bandgap difference $\Delta Eg$ is equal to or more than 0.3 eV, the threshold current $I_{th}$ remains low regardless of the operating temperature. The threshold current $I_{th}$ is kept to be as small as 18 mA even in high temperature of 85 Celsius degree if the bandgap difference $\Delta Eg$ is equal to or more than 0.3 eV.

FIG. 12 shows graphs representing the calculated results of the current vs. optical output characteristics at the bandgap values listed in FIG. 11. Area (a) in FIG. 12 shows a graph representing the calculated results of the current vs. optical output characteristics at the temperature of 25 Celsius degree. Area (b) in FIG. 12 shows a graph representing the calculated results of the current vs. optical output characteristics at the temperature of 85 Celsius degree. In areas (a) and (b) of FIG. 12, curves G11 and G21 correspond to the bandgap difference $\Delta Eg$ of 0.24 eV. Curves G12 and G22 correspond to the bandgap difference $\Delta Eg$ of 0.27 eV. Curves G13 and G23 correspond to the bandgap difference $\Delta Eg$ of 0.30 eV. Curves G14 and G24 correspond to the bandgap difference $\Delta Eg$ of 0.33 eV. curves G15 and G25 correspond to the bandgap difference $\Delta Eg$ of 0.36 eV. Curves G16 and G26 correspond to the bandgap difference $\Delta Eg$ of 0.49 eV. As seen from FIG. 12, the greater the bandgap is, the larger the emission efficiency is. This is because the large band gap difference ΔEg permits the pn junction between the first conductive type semiconductor region 53 and the second conductive type semiconductor region 57 to effectively block carriers, thereby confining the carriers into the active layer 55.

Figure 13:
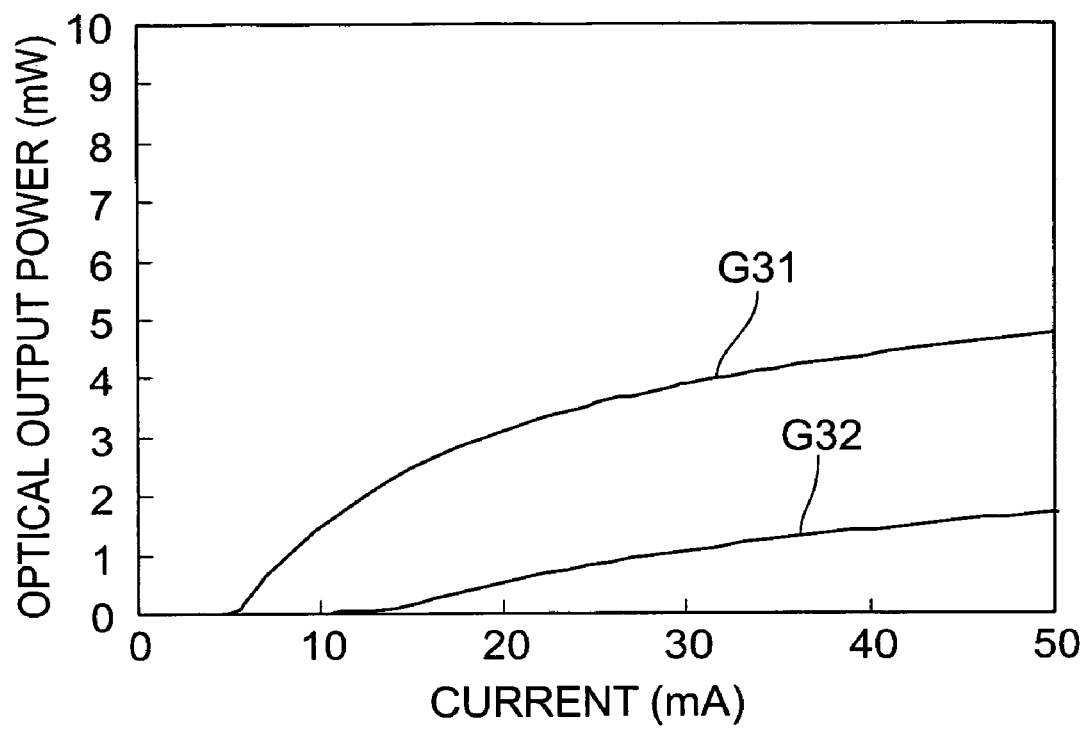
FIG. 13 schematically shows current vs. voltage and current vs. optical output power characteristics for the semiconductor optical device made of material lattice-matched to InP semiconductor.

The inventors have also studied optical semiconductor devices formed on InP substrates. In a specific optical semiconductor device, InP is used as material of the first and second semiconductor regions and $Ga_{0.39}In_{0.61}As_{0.845}P_{0.155}$ is used as material of the active layer. The bandgap energy difference ΔEg between the active layer and the first and second semiconductor regions is 0.55 eV. FIG. 13 is a calculated result showing the current vs. optical output characteristics of the semiconductor optical device made using semiconductor material lattice-matched to InP of the substrate. Curve G31 indicates data measured at 25 Celsius degree and curve G32 indicates data measured at 85 Celsius degree. As shown in FIG. 13, in a semiconductor optical device using semiconductor material lattice-matched to InP of the substrate, the optical power from the semiconductor optical device is saturated in a range of a few milli-watts even at a relatively low device temperature. Therefore, this device cannot be applied to a practical use. This saturation may be caused by leakage current flowing outside the active layer in the semiconductor optical device including semiconductors grown on the InP substrate. On the other hand, if the bandgap energy difference ΔEg is greater than 0.55 eV in the semiconductor optical device 51 according to the present embodiment, carriers are effectively confined into the active layer.

Since the active layer 55 and the first and second conductive type semiconductor regions 53, 57 are provided on the surface of GaAs substrate, the semiconductor optical device 51 has the above advantage. FIG. 14 lists the combinations of material that can provide the advantage. The bandgap energy difference ΔEg by use of materials listed in FIG. 14 can be more than 0.3 eV (or 0.55 eV) by adjusting compositions of the materials. The material listed in FIG. 14 can be used for the semiconductor optical device 1 and other semiconductor optical devices according to the embodiments without limiting to the semiconductor optical device 51. These semiconductor optical devices have superior temperature characteristics as good as the semiconductor optical device 51.

Specific combinations selected from FIG. 14 are further explained below. In the semiconductor optical device including the active layer 55 made of III-V compound semiconductor containing at least nitrogen, the following materials having high bandgap energy can be used for the first and second conductive semiconductor regions 53 and 57: AlGaInP, GaInP, AlGaAs and GaInAsP. Especially, the bandgap energies of AlGaInP, AlGaAs and GaInAsP are greater than that of InP and these materials provide the following bandgap energy ranges: 1.9 eV to 2.3 eV, 1.42 eV to 2.16 eV and 1.42 eV to 1.9 eV, respectively. GaInP has the high bandgap energy of 1.9 eV. If one of the above materials is used for the first semiconductor region 53 and the second semiconductor region 57, the bandgap difference ΔEg can be made larger, leading to a strong carrier confinement into active layer 55. Consequently, the semiconductor optical device 51 exhibits excellent temperature characteristics. In addition, the above materials permit the turn-on voltage difference between the A and B portions shown in FIG. 3 to increase, so that the liner operation region becomes large.

The active layer 55 made of the III-V compound semiconductor containing at least nitrogen in the semiconductor optical device can generate light of a wavelength longer than 1 micrometer, such as 1.3 or 1.55 micrometer band for optical communications. An example of material preferable for the active layer 55 is III-V compound semiconductors containing at least nitrogen, gallium and arsenic. These III-V compound semiconductors have lattice constants equal to or close to the lattice constant of GaAs and therefore can be grown on GaAs substrates with excellent crystalline quality. Examples of the III-V compound semiconductors containing at least nitrogen, gallium and arsenic are GaNAs and GaInNAs. The III-V compound semiconductors containing at least nitrogen, gallium and arsenic can be lattice-matched to GaAs by adjusting their compositions property. These III-V compound semiconductors are used for generating light of a long wavelength from 1 to 1.6 micrometers.

The active layer 55 can be made of material containing phosphorus and/or antimony in addition to the constituents of GaNAs or GaInNAs. Antimony can work as surfactant and can suppress three-dimensional growth of GaNAs and GaInNAs crystal, thereby improving the crystal quality. Phosphorus can improve the crystal quality and reliability by reducing the local crystal strain in GaNAs and GaInNAs. Phosphorus contributes to a the introduction of nitrogen into the active layer 55 during crystal growth. Examples of material for the active layer 55 are listed below: GaNAsP, GaInNAsP, GaNAsSb, GaInNAsSb, GaNAsSbP, GaInNAsSbP and so on.

The active layer 55 can be made of III-V compound semiconductor not containing nitrogen, such as AlGaInP, GaInP, AlGaAs, GaAs, GaInAsP or GaInAs. The active layer 55 of the above material is used for generating red to near infrared light of wavelength, 0.6 to 1 micrometer. In this optical semiconductor device, AlGaInP, GaInP, AlGaAs or GaInAsP can be used for the first conductive type semiconductor region 53 and the second conductive type semiconductor region 57. Since the AlGaInP has a large bandgap up to 2.3 eV depending on its composition, the first conductive type semiconductor region 53 and the second conductive type semiconductor region 57 made of AlGaInP permits the bandgap energy difference ΔEg to increase.

FIG. 15 is a view showing another modified semiconductor optical device. Area (a) in FIG. 15 shows a cross sectional view. Area (b) in FIG. 15 shows a band diagram, taken along VIa-VIa in area (a), for the semiconductor optical device according to this embodiment. Area (c) in FIG. 14 shows a refractive index diagram, taken along VIb-VIb in area (a), for the semiconductor optical device according to the present embodiment. A semiconductor optical device 51a includes first and second spacer layers 75 and 77. The first spacer layer 75 is provided between the active layer 55 and the first conductive type semiconductor region 53 and the second spacer layer 77 is provided between the active layer 55 and the second conductive type semiconductor region 57. The active layer 55 and the first and second spacer layers 75 and 77 constitute a semiconductor mesa portion 63a.

The first and second spacer layers 75 and 77 have the same structure and functions as the first and second spacer layers 25 and 27 described in the first embodiment. The first spacer layer 75 is made of material having a bandgap energy between that of the first conductive type semiconductor layer 53 and that of the active layer 55. The second spacer layer 77 is made of material having a bandgap energy between that of the second conductive type semiconductor layer 57 and that of the active layer 55. As shown in area (c) of FIG. 15, the first spacer layer 75 has a refractive index between that of the active layer 55 and that of the first conductive type semiconductor layer 53, and the second spacer layer 77 has a refractive index between that of the active layer 55 and that of the second conductive type semiconductor layer 57. Therefore, the first and second spacer layers 75 and 77 permit the current confinement into the active layer 55 separately. These spacer layers 75 and 77 enhance the confinement of the light into the active layer 55, which leads to the improvements of the lasing characteristics such as a threshold current reduction and a less dependence on temperature.

In the present embodiment, the first conductive type semiconductor region 53 can be made of material that functions as a etch stopper for etching active layer 55 and the first and second spacer layers 75 and 77. In buried heterostructures as disclosed in Publication 1, etching the active layer into a mesa-shape is carried out using wet etching in most cases to avoid the damage of semiconductor portions. Since wet etching is, however, isotropic, the etchant etches the active layer in both horizontal and vertical directions. Consequently, the width of the active layer is varied depending on the mesa depth. For example, in the fabrication of the semiconductor laser device as described in Publication 1, etchant of Br-methanol is generally used to etch the active layer made of GaInAsP. But, the n-type InP cladding layer is etched by the etchant of Br-methanol and this etchant can etch not only the active layer but also the n-type InP cladding layer located just below the active layer. Etching rates in wet etchings are varied depending on even slight fluctuations of the etchant temperature, the etchant concentration and the mixture ratios of etchant. Especially, Br-methanol is volatile and thus the etching rate thereof is easily varied. In addition, etching rates on the wafer cannot be constant all over the surface of the wafer due to the difference of stirring speed of the etchant between the center the periphery of the wafer. Due to this variation of etching rate, the mesa depth varies in every production and all over the surface of the wafer. Consequently, the width of the active layer is also varied. Accordingly, precise control of the width of the active layer is difficult, which would affect the reproducibility and uniformity of laser characteristics.

On the other hand, since the semiconductor optical device 51 according to the present embodiment uses the GaAs substrate, AlGaInP or GaInP can be used for the first conductive type semiconductor region 53, AlGaAs, GaAs and GaInAsP can be used for the first and second spacer layers 75, 77 and AlGaAs, GaAs, GaInAsP, GaInAs and III-V compound semiconductor containing at least nitrogen, gallium and arsenic can be used for the active layer 55. In this case, the first conductive type semiconductor region 53 works as an etch stopper in etchings of the active layer 55 the first and second spacer layers 75, 77 by use of appropriate etchant (for example, phosphoric-acid-based etchant), whereby the active layer 55 and the first and second spacer layers 75 and 77 are etched without etching of the first conductive type semiconductor region 53. As a result, the excellent reproducibility and uniformity of the mesa depth of the active layer 55 and the first and second spacer layers 75 and 77 are obtained and accordingly the better reproducibility and uniformity of the width of the active layer 55 are obtained, thereby improving the reproducibility and uniformity of laser characteristics.

Figure 16:
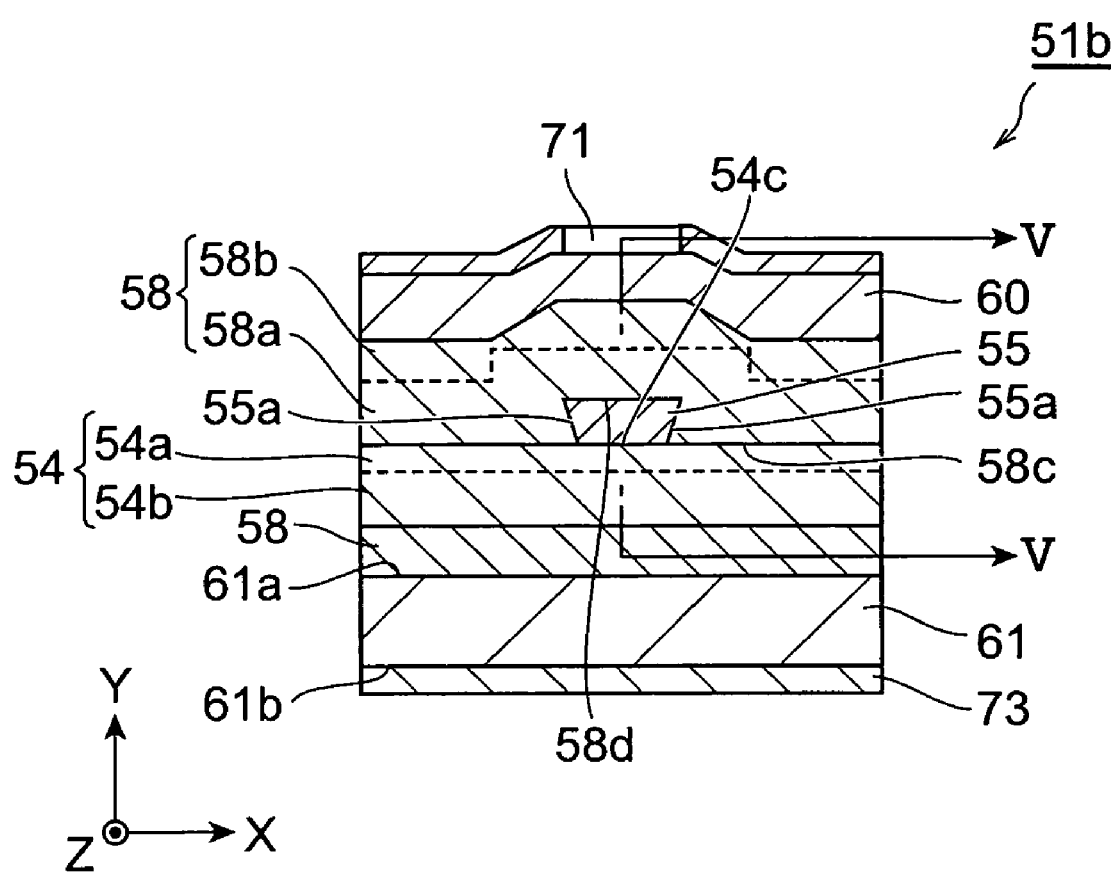
FIG. 16 is a cross sectional view showing still another modified semiconductor optical device.

FIG. 16 is a cross sectional view showing still another modified semiconductor optical device. In this modified semiconductor optical device, the first conductive type semiconductor region 54 has a third region 54a and fourth region 54b. The second conductive type semiconductor region 58 has a first region 58a and a second region 58b. The third region 54a of the first conductive type semiconductor region 54 has an interfacial region 54c on which the second conductive type semiconductor region 58 is provided. The first region 58a of the second conductive type semiconductor region 58 has interfacial regions 58c and 58d on which the first conductive type semiconductor region 54 is provided. In the first conductive type semiconductor region 54, the dopant concentration of the third region 54a is different from that of the fourth region 54b. In the second conductive type semiconductor region 58, the dopant concentration of the first region 58a is different from that of the second region 58b.

Figure 17:
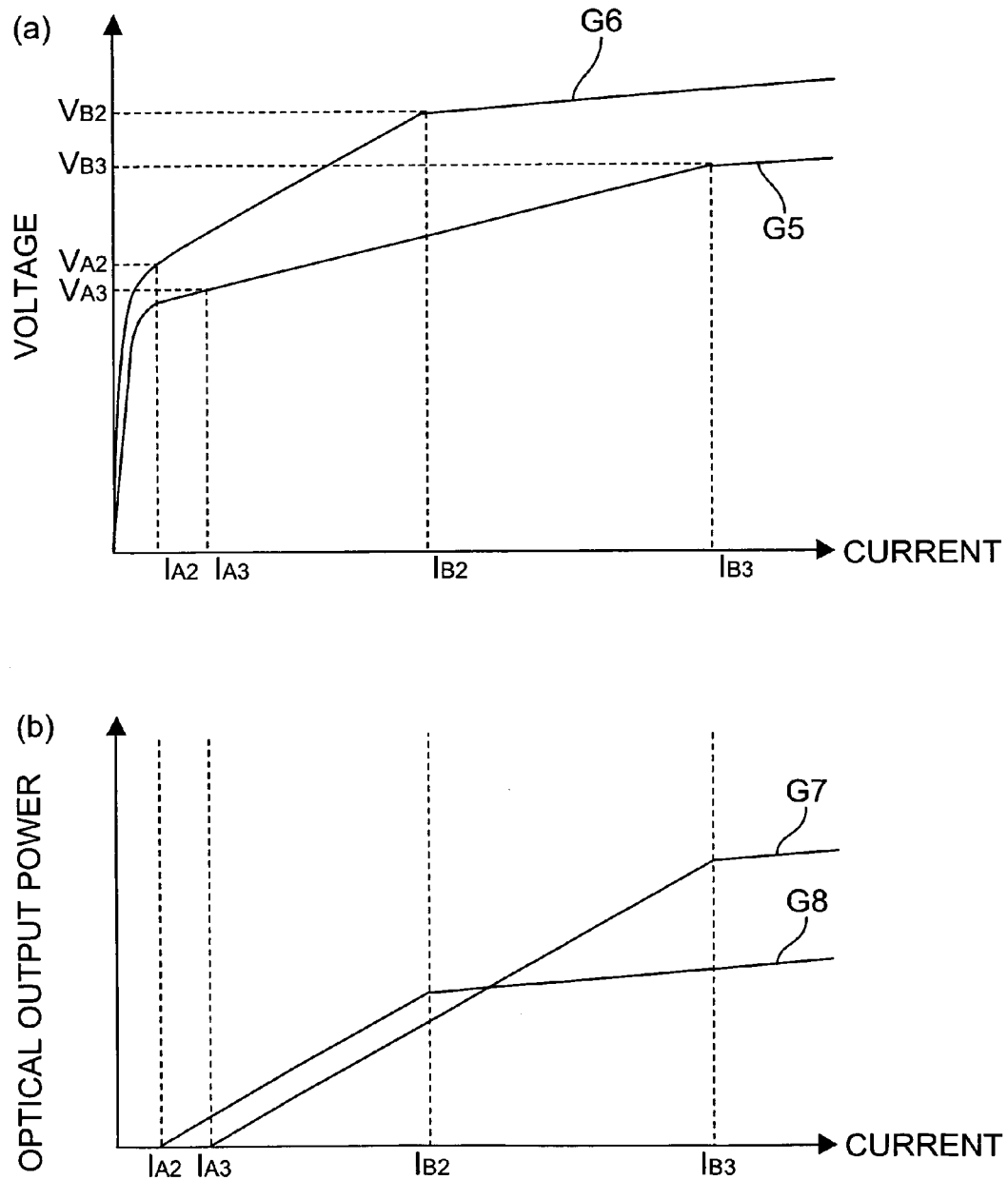
FIG. 17 schematically shows current vs. voltage and current vs. optical output power characteristics for the semiconductor optical device.

FIG. 17 schematically shows the current vs. voltage and the current vs. optical output power characteristics for the semiconductor optical device. Curve G5 in area (a) in FIG. 17 indicates a current vs. voltage relationship of the semiconductor optical device 51b. Curve G6 in area (a) in FIG. 17 indicates a current vs. voltage relationship of the semiconductor optical device, unlike in the case of the semiconductor optical device 51b, which does not have the third and the first regions 54a and 58a doped heavily. Curves G7 and G8 in area (b) in FIG. 17 indicate current vs. optical power that correspond to curves G5 and G6, respectively. In the semiconductor optical device 51b, since the dopant concentrations of the third region 54a and the first region 58a are different from those of the regions 54b and 58b, the quasi-Fermi levels and resistance values of the third region 54a and first region 58a are different from those of the regions 54b and 58b, respectively. Due to this difference, the turn-on voltages of the pn junction constituted by the first conductive type semiconductor region 54 and the second conductive type semiconductor region 58 and the pin junction constituted by the first conductive type semiconductor region 54, the active region 55 and the second conductive type semiconductor region 58 are changed accordingly. Furthermore, the series resistance of the semiconductor optical device 51b is also changed in the linear operation region which appears after turning on the pin junction portion. For example, if the third region 54a and first region 58a are doped more heavily than the regions 54b and 58b, the resistance of these cladding parts becomes low, whereby the turn-on voltages of the pn junction and pin junction are lowered. As a result, as shown in areas (a) and (b) of FIG. 17, the turn-on voltage $V_{A2}$ of the pin junction portion is changed to a lower turn-on voltage $V_{A3}$ and the turn-on voltage $V_{B2}$ of the pn junction portion is changed to a lower turn-on voltage $V_{B3}$. Furthermore, since the resistance values of the third region 54a and first region 58a are also lowered, the slope of curve of the current vs. voltage relationship (series resistance) becomes small in the linear operation region after turning on the pn junction portion. Consequently, since the current at which the pn junction portion is turned on is increased from current $I_{B2}$ to $I_{B3}$, the width of the linear operation region in the current vs. optical power relationship is enlarged, thereby increasing the optical power. As described in above, turn-on voltages and the above series resistance values are changed by changing the dopant concentrations of the regions 54a and 58a, so that the range of the linear operation region can be changed as required. In the above example, although the dopant concentrations of both the regions 54a and 58a are changed, the dopant concentration of one of the regions 54a and 58a may be changed, thereby providing the similar advantages as above.

The turn-on voltages as above can be also adjusted by the change of the dopant concentration of the whole of the first conductive type semiconductor region 54 (and/or the whole of the second conductive type semiconductor region 58).

Besides, the turn-on voltages can be also adjusted by changing the dopant concentration of only one of the first conductive type semiconductor region 54 and the second conductive type semiconductor region 58. In the above example of the optical device 51b, dopant concentration changes are performed in only necessary parts of the first conductive type semiconductor region 54 and the second conductive type semiconductor region 58. This is preferable for minimizing the degradation of other device characteristics caused by the dopant concentration change. The semiconductor optical device 1 in the first embodiment, the semiconductor optical device 51b in the present embodiment and other semiconductor optical device according to the present invention can be formed by use of the control method of changing dopant concentrations of parts or the whole of the first conductive type semiconductor region and the second conductive type semiconductor region.

Having described the first and second embodiments with reference to a number of modifications, the present invention is not limited to the above. In still another semiconductor optical device, the first conductive type semiconductor region and the second conductive type semiconductor region can be made of material not containing aluminum. If material containing aluminum is used for the first conductive type semiconductor region and/or the second conductive type semiconductor region, the interfaces among the first and second conductive type semiconductor regions and the active layer and spacer layers and between the first and second conductive type semiconductor regions are oxidized as time goes on, whereby the number of nonradiative recombination centers are increased. Consequently, the optical characteristics and the reliability of the semiconductor optical device are deteriorated. In addition, if the first conductive type semiconductor region is made of material containing aluminum, the surface of the first conductive type semiconductor region may be easily oxidized and it is difficult to grow the second conductive type semiconductor region thereon due to the surface oxidization. On the other hand, if the first and second conductive type semiconductor regions are made of material not containing aluminum, the generation of nonradiative recombination center at the interface regions is avoided and the second conductive type semiconductor region having excellent quality is grown thereon. Furthermore, if the second conductive type semiconductor region is made of material not containing aluminum, the contact layer and the remaining of the second conductive type semiconductor region both having excellent quality are grown thereon in the second crystal growth step. For example, GaInP and GaInAsP can be used as a material not containing aluminum.

The first conductive type semiconductor region has a part contacting the second conductive type semiconductor region (for example, the third region 54a in FIG. 16) and the second conductive type semiconductor region has a part contacting the first conductive type semiconductor region (for example, the first region 58a in FIG. 16). These parts can be made of material not containing aluminum. This structure provides the same advantages as those of the semiconductor optical device including the whole of the first conductive type semiconductor region and the whole of the second conductive type semiconductor region both made of material not containing aluminum. Since the parts of the first and second conductive type semiconductor regions that are not contacted with other semiconductor portions can be made of material containing aluminum, these regions can be made of material containing aluminum or not containing aluminum, which increases the flexibility in designing semiconductor optical devices. Examples of material not containing aluminum are listed as follows: GaInP, GaAs, GaInAsP, GaInAs and so on.

In addition to the above structures, the active layer and spacer layers may be made of material not containing aluminum. If these layers are made of material not containing aluminum, all the layers in the semiconductor optical device do not contain aluminum. Then, this semiconductor optical device is free from aluminum oxidization related matters, thereby providing the semiconductor optical device with high performance and reliability. Examples of material of the active layer are listed below: GaAs, GaInAs, GaInAsP and so on. Examples of material of the spacer layers are listed as follows: GaAs and GaInAsP.

If the active layer has a quantum well structure, the active layer may have a composition such that the lattice mismatch between the active layer and the substrate or base layer is from +3% to −3%. Since the thickness of the well layers can be very thin and thinner than the critical thickness, the above range of lattice mismatch does not generate crystal defects such as misfit dislocation, and a good crystalline quality can be maintained. In this case, since the restriction on the lattice match condition between the active layer and the base layer is alleviated, these layers can be made of a wider range of materials. Accordingly, the bandgap energy of the active layer can be changed more widely, leading to more flexibility in designing the semiconductor optical devices.

Having described and illustrated the principle of the invention in a preferred embodiment thereof, it is appreciated by those having skill in the art that the invention can be modified in arrangement and detail without departing from such principles. For example, the semiconductor optical device encompasses not only semiconductor lasers, but also semiconductor light-emitting diodes, semiconductor optical amplifiers, semiconductor electro-absorption modulators, semiconductor optical wave guide, semiconductor optical integrated devices and the like, as well as integrated devices integrating these devices. Details of structures of these devices can be modified as necessary. We therefore claim all modifications and variations coming within the spirit and scope of the following claims.

What is claimed is:

1. A semiconductor optical device comprising:
    a first conductive type semiconductor region including a first semiconductor portion and a second semiconductor portion, the first semiconductor portion having a first region and a second region, the first and second regions being arranged along a predetermined plane, the second semiconductor portion being provided on the first region of the first semiconductor portion, and the second semiconductor portion having a side;
    an active layer provided on the second semiconductor portion of the first conductive type semiconductor region, the active layer having a top and a side, and a bandgap energy of the first conductive type semiconductor region being greater than that of the active layer;
    a second conductive type semiconductor region provided on the second region of the first semiconductor portion of the first conductive type semiconductor region, the side of the second semiconductor portion of the first conductive type semiconductor region, the top and side of the active layer, the second region of the first conductive type semiconductor region and the second conductive type semiconductor region constituting a pn junction, and a bandgap energy of the second conductive type semiconductor region being greater than that of the active layer;

a first distributed Bragg reflector portion including first distributed Bragg reflector layers and second distributed Bragg reflector layers, and the first and second distributed Bragg reflector layers being arranged alternately; and a second distributed Bragg reflector portion including third distributed Bragg reflector layers and fourth distributed Bragg reflector layers, the third and fourth distributed Bragg reflector layers being arranged alternately, the first conductive type semiconductor region, and the active layer and the second conductive type semiconductor region being provided between the first distributed Bragg reflector portion and the second distributed Bragg reflector layers.

2. The semiconductor optical device according to claim 1, wherein a difference between a bandgap energy of the first conductive type semiconductor region and that of the active layer is equal to or more than $4.8 \times 10^{-20}$ Joule and a difference between a bandgap energy of the second conductive type semiconductor region and that of the active layer is equal to or more than $4.8 \times 10^{-20}$ Joule.

3. The semiconductor optical device according to claim 1, wherein the first conductive type semiconductor region is made of AlGaAs, AlGaInP, GaInP and GaInAsP, the second conductive type semiconductor region is made of AlGaAs, AlGaInP, GaInP and GaInAsP, and the active layer is made of III-V compound semiconductor containing at least nitrogen.

4. The semiconductor optical device according to claim 1, further comprising:
a second conductive type semiconductor contact layer provided on the second conductive type semiconductor region; and
an electrode provided on the second conductive type semiconductor contact layer.

5. The semiconductor optical device according to claim 1, wherein the first conductive type semiconductor region includes a third region and a fourth region, the third region and the second conductive type semiconductor region constitute the pn junction, and a dopant concentration of the third region is different from that of the fourth region.

6. The semiconductor optical device according to claim 1, wherein the second conductive type semiconductor region includes a first region and a second region, the first region of the second conductive type semiconductor region and the first conductive type semiconductor region constitute the pn junction, and a dopant concentration of the first region of the second conductive type semiconductor region is different from that of the second region of the second conductive type semiconductor region.

7. The semiconductor optical device according to claim 1, further comprising:
a first spacer layer provided between the active layer and the first conductive type semiconductor region; and
a second spacer layer provided between the active layer and the second conductive type semiconductor region.

8. The semiconductor optical device according to claim 1, wherein the semiconductor optical device includes at least one of a semiconductor laser, a light emitting diode, a semiconductor optical amplifier, an electro-absorption type modulator and a semiconductor optical waveguide.

* * * * *